(12) United States Patent
Begley et al.

(10) Patent No.: US 7,517,595 B2
(45) Date of Patent: *Apr. 14, 2009

(54) ELECTROLUMINESCENT DEVICES WITH MIXED ELECTRON TRANSPORT MATERIALS

(75) Inventors: William J. Begley, Webster, NY (US); Tukaram K. Hatwar, Penfield, NY (US); Ralph H. Young, Rochester, NY (US); Natasha Andrievsky, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 213 days.

This patent is subject to a terminal disclaimer.

(21) Appl. No.: 11/215,505

(22) Filed: Aug. 30, 2005

(65) Prior Publication Data

US 2006/0204786 A1    Sep. 14, 2006

Related U.S. Application Data

(63) Continuation-in-part of application No. 11/076,821, filed on Mar. 10, 2005, now abandoned.

(51) Int. Cl.
*H01L 51/54* (2006.01)
(52) U.S. Cl. .................. 428/690; 428/917; 313/504; 313/506
(58) Field of Classification Search ............. 428/690; 313/504, 506
See application file for complete search history.

(56) References Cited

U.S. PATENT DOCUMENTS

| | | | |
|---|---|---|---|
| 4,539,507 A | 9/1985 | VanSlyke et al. | |
| 4,769,292 A | 9/1988 | Tang et al. | |
| 5,516,577 A | 5/1996 | Matsuura et al. | |
| 5,601,903 A | 2/1997 | Fujii et al. | |
| 5,925,980 A | 7/1999 | So et al. | |
| 6,097,147 A | 8/2000 | Baldo et al. | |

(Continued)

FOREIGN PATENT DOCUMENTS

EP    1 017 118    7/2000

(Continued)

OTHER PUBLICATIONS

W. J. Begley, et al, "Organic Light-Emitting Devices with Mixed Electron Transport Materials", U.S. Appl. No. 11/077,218, filed Mar. 10, 2005.

(Continued)

*Primary Examiner*—Dawn Garrett
(74) *Attorney, Agent, or Firm*—Arthur E. Kluegel; Raymond L. Owens

(57) ABSTRACT

An OLED device comprises a cathode, an anode, a light emitting layer, and on the cathode side of said emitting layer, a further layer, wherein the further layer is an electron-transporting layer containing:
 a) a first compound that has the lowest LUMO value of the compounds in the layer, the amount being greater than 40% by volume and less than 100% by volume of the layer; and
 b) at least one second compound that is a low voltage electron transport material, exhibiting a higher LUMO value than the first compound, the total amount of said compound(s) being less than 60% by volume and more than 0% by volume of the layer.

9 Claims, 2 Drawing Sheets

U.S. PATENT DOCUMENTS

| | | | |
|---|---|---|---|
| 6,150,042 A | 11/2000 | Tamano et al. | |
| 6,172,459 B1 | 1/2001 | Hung et al. | |
| 6,396,209 B1 | 5/2002 | Kido et al. | |
| 6,475,648 B1* | 11/2002 | Hatwar et al. | 428/690 |
| 6,692,846 B2* | 2/2004 | Hatwar et al. | 428/690 |
| 2001/0051284 A1* | 12/2001 | Ueda et al. | 428/690 |
| 2001/0052751 A1 | 12/2001 | Wakimoto et al. | |
| 2002/0081456 A1 | 6/2002 | Hamada | |
| 2002/0086180 A1 | 7/2002 | Seo et al. | |
| 2004/0001968 A1* | 1/2004 | Hatwar et al. | 428/690 |
| 2004/0066135 A1 | 4/2004 | Lecloux et al. | |
| 2004/0126619 A1 | 7/2004 | Nishita | |
| 2004/0207318 A1 | 10/2004 | Lee et al. | |
| 2005/0095451 A1* | 5/2005 | Begley et al. | 428/690 |
| 2005/0151466 A1 | 7/2005 | Liao et al. | |

FOREIGN PATENT DOCUMENTS

| | | |
|---|---|---|
| EP | 1 435 669 | 7/2004 |
| JP | 04-335087 | 5/1991 |
| JP | 2000133458 | 5/2000 |
| WO | 03/060956 | 7/2003 |
| WO | 2004/077886 | 9/2004 |

OTHER PUBLICATIONS

S. R. Conley, et al., "Organic Electroluminescent Device", U.S. Appl. No. 11/076,720, filed Mar. 10, 2005.

* cited by examiner

ELECTROLUMINESCENT DEVICES WITH MIXED ELECTRON TRANSPORT MATERIALS

CROSS-REFERENCE TO RELATED APPLICATIONS

This application is a continuation-in-part of U.S. Ser. No. 11/076,821 filed Mar. 10, 2005, now abandoned, the contents of which are incorporated herein by reference.

FIELD OF THE INVENTION

This invention relates to an organic light emitting diode (OLED) electroluminescent (EL) device and more particularly to a device comprising a layer between a light emitting layer and the cathode containing a mixture of at least two compounds.

BACKGROUND OF THE INVENTION

While organic electroluminescent (EL) devices have been known for over two decades, their performance limitations have represented a barrier to many desirable applications. In a basic two-layer EL device structure, described first in U.S. Pat. No. 4,356,429, one organic layer of the EL element adjacent to the anode is specifically chosen to transport holes, therefore, it is referred to as the hole-transporting layer, and the other organic layer is specifically chosen to transport electrons, referred to as the electron-transporting layer. The interface between the two layers provides an efficient site for the recombination of the injected hole/electron pair and the resultant electroluminescence.

These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322-334, 1969; and Dresner U.S. Pat. No. 3,710,167, issued Jan. 9, 1973. The organic layers in these devices, usually composed of a polycyclic aromatic hydrocarbon, were very thick (much greater than 1 µm). Consequently, operating voltages were very high, often >100V.

More recent multilayer organic EL devices include an organic EL element consisting of extremely thin layers (e.g. <1.0 µm) between the anode and the cathode. Reducing the thickness lowered the resistance of the organic layer and has enabled devices that operate at much lower voltage. Because of their low driving voltage, high luminance, wide-angle viewing and capability for full-color flat emission displays, these devices are now more attractive for many display applications. Tang et al., has described this multilayer OLED device in U.S. Pat. Nos. 4,769,292; 4,885,211 and in *J. Applied Physics*, Vol. 65, Pages 3610 -3616, 1989 which describe an organic light-emitting layer (LEL) between the hole-transporting layer and electron-transporting layer wherein the light-emitting layer commonly consists of a host material doped with a guest material—dopant, which results in an efficiency improvement and allows for color tuning.

EL devices in recent years have expanded to include not only single color emitting devices, such as red, green and blue, but also white-devices, devices that emit white light. Efficient white light producing OLED devices are highly desirable in the industry and are considered as a low cost alternative for several applications such as paper-thin light sources, backlights in LCD displays, automotive dome lights, and office lighting. White light producing OLED devices should be bright, efficient, and generally have Commission International d'Eclairage (CIE) chromaticity coordinates of about (0.33, 0.33). In any event, in accordance with this disclosure, white light is that light which is perceived by a user as having a white color.

Since the early inventions, further improvements in device materials have resulted in improved performance in attributes such as color, stability, luminance efficiency and manufacturability, e.g., as disclosed in U.S. Pat. Nos. 5,061,569, 5,409,783, 5,554,450, 5,593,788, 5,683,823, 5,908,581, 5,928,802, 6,020,078, and 6,208,077, amongst others.

Notwithstanding all of these developments, there are continuing needs for organic EL device components, such as electron transporting materials and or electron injecting materials, that will provide even lower device drive voltages and hence lower power consumption, while maintaining high luminance efficiencies and long lifetimes combined with high color purity.

A useful class of electron transporting materials is that derived from metal chelated oxinoid compounds including chelates of oxine itself, also commonly referred to as 8-quinolinol or 8-hydroxyquinoline. Tris(8-quinolinolato)aluminum (III), also known as Alq or $Alq_3$, and other metal and non-metal oxine chelates are well known in the art as electron transporting materials.

Tang et al., in U.S. Pat. No. 4,769,292 and VanSlyke et al., in U.S. Pat. No. 4,539,507 lower the drive voltage of the EL devices by teaching the use of Alq as an electron transport material in the luminescent layer or luminescent zone.

Baldo et al., in U.S. Pat. No. 6,097,147 and Hung et al., in U.S. Pat. No. 6,172,459 teach the use of an organic electron transporting layer adjacent to the cathode so that when electrons are injected from the cathode into the electron transporting layer, the electrons traverse both the electron transporting layer and the light emitting layer.

Tamano et al., in U.S. Pat. No. 6,150,042 teaches use of hole-injecting materials in an organic EL device. Examples of electron transporting materials useful in the device are given and included therein are mixtures of electron transporting materials. There is no indication of how to select the electron transporting materials in terms of Lowest Unoccupied Molecular Orbital levels (LUMOs) and no reference to low drive voltage with the devices.

Organometallic complexes, such as lithium quinolate have been used in EL devices, for example see WO 0032717 and US 2005/0106412. In particular, mixtures of lithium quinolate-and Alq have been described as useful, for example in U.S. Pat. No. 6,396,209 and US 2004/0207318. However, lithium quinolate, when used in an OLED device as the only electron-transporting material, results in a device with high drive voltage.

Seo et al., in US2002/0086180A1 teaches the use of a 1:1 mixture of Bphen, (also known as 4,7-diphenyl-1,10-phenanthroline or bathophenanthroline) as an electron transporting material, and Alq as an electron injection material, to form an electron transporting mixed layer. However, the Bphen/Alq mix of Seo et al., shows inferior stability and falls outside the scope of the current invention.

However, these devices do not have the desired EL characteristics in terms of luminance and stability of the components in combination with low drive voltages.

The problem to be solved therefore, is to provide an OLED device having a light-emitting layer (LEL) that exhibits good luminance efficiency and stability while at the same time requiring low drive voltages for reduced power consumption.

SUMMARY OF THE INVENTION

The invention provides an OLED device comprising a cathode, an anode, a light emitting layer, and on the cathode side of said emitting layer, a further layer, wherein the further layer is an electron-transporting layer containing:
  a) a first compound that has the lowest LUMO value of the compounds in the layer, the amount being greater than 10% by volume and less than 100% by volume of the layer;
  b) at least one second compound that is a low voltage electron transport material, exhibiting a higher LUMO value than the first compound, the total amount of said compound(s) being less than or equal to 90% by volume and more than 0% by volume of the layer;
  provided, that when paragraphs a) and b) each contain a single compound and the compound of paragraph a) is tris(8-quinolinolato)aluminum(III), then the compound of paragraph b) is not 4,7-diphenyl-1,10-phenanthroline; and
  provided further that when paragraphs a) and b) each contain a single compound and the compound of paragraph b) is tris(8-quinolinolato)aluminum(III), then the compound of paragraph a) is not 2,2'-(1,1'-biphenyl)-4,4'-diylbis(4,6-(p-tolyl)-1,3,5-triazine).

It has been found that mixing a first compound with a second compound that is a low voltage electron transport material, to form a layer on the cathode side of the emitting layer in an OLED device, gives an OLED device that has a drive voltage even lower than that of the device with the low voltage electron transport material alone

DETAILED DESCRIPTION OF THE INVENTION

Figure 1:
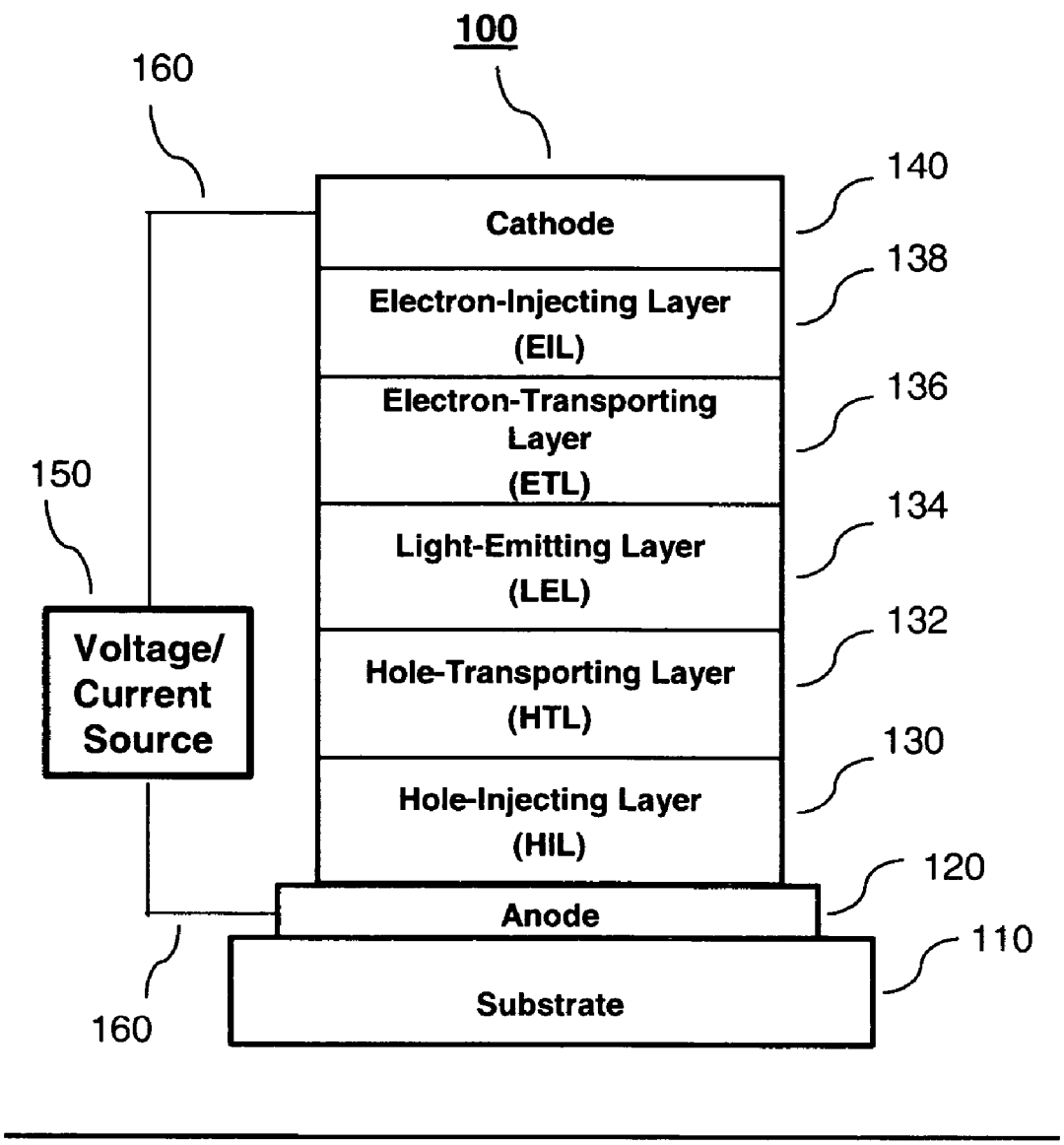
FIG. 1 shows a cross-sectional view of one embodiment of the present invention wherein the first compound and the second compound(s) are located in the electron-transporting layer (ETL, 136). The figure shows a hole-injecting layer (HIL, 130) and an electron-injecting layer (EIL, 138), but these are optional.

The invention is generally as described above. An OLED device of the invention is a multilayer electroluminescent device comprising a cathode, an anode, hole-injecting layer(s) (if necessary), electron-injecting layer(s) (if necessary), hole-transporting layer(s), electron-transporting layer(s) and a light-emitting layer(s) (LEL). The further layer of the invention is located on the cathode side of the emitting layer and contains at least two different compounds, a first compound and a second compound. The first compound has the lowest LUMO value of the compounds in the layer. The second compound(s), has a higher LUMO value(s) than the first compound and at least one of the second CPDs is a low voltage electron-transport material.

The first compound of the invention has a Lowest Unoccupied Molecular Orbital (LUMO) value lower than the LUMO value of the second compound, the low voltage electron transport material. In other words, the second compound has a higher LUMO value than the first compound. In one suitable embodiment, the first compound has a LUMO value lower than −2.30 eV, or commonly lower than −2.40 eV and typically lower than −2.50 eV or −2.60 eV and desirably lower than −2.70 eV or even lower than −3.00 eV.

In addition to lower drive voltage, the devices containing mixtures of the above mentioned first and second compounds also have good luminance efficiency, good operational stability and show low voltage rise during stability testing. Further embodiments of the invention support more than one second compound in said layer. For simplicity, preferred embodiments of the invention are those that contain one first compound and one second compound. The amount of the first compound present in the layer is greater 10% by volume, but cannot be 100%. The total amount of the second compound(s), the low voltage electron transporting material(s), present in the layer is less than 90% by volume, but cannot be 0%.

At least one of the second compounds is a low voltage electron transport material. As used herein, the term "low voltage electron transport material" is a material that when incorporated as the sole material in the electron-transporting layer of a device as described in Example 3, results in a test voltage (or drive voltage) no more than 50% greater than an analogous device using Alq (tris(8-quinolinolato)aluminum (III)) as the sole material in the electron-transporting layer. Thus, a test for a low-voltage material involves fabricating a device using Alq as the sole electron transport material as in Example 3. A second device is fabricated replacing Alq with the material to be tested as the sole low-voltage electron transport material. If the second device has test voltage no more than 50% greater than the device using Alq, than the test material is considered a "low-voltage electron transport material". More desirable low-voltage electron transport materials afford a test voltage no more than 40% greater, more suitably no more than 30%, and desirably no more than 25% greater than Alq. Ideally, low-voltage electron transport materials afford a test voltage no more than 20% greater than Alq, suitably no more than 10% greater, and preferably equal to or less than Alq, under the test conditions.

Typically, "low voltage electron transport materials" when incorporated alone into the electron transporting layer, as described in paragraph d) of the devices of Examples 3 and 4, result in drive voltages of 12 volts or less. Low voltage electron transport materials with drive voltages of 10 volts or less are also useful as second compounds of the invention while materials of 8 volts or less are preferred as second compounds In a preferred embodiment of the invention there is a first compound and only one second compound. In other embodiments of the invention there may be more than one second compound. In one embodiment, the layer comprises only a first compound and a second compound wherein neither the first nor the second compounds include an organic metal complex compound containing an alkali metal ion, an alkali earth metal ion, or a rare earth metal ion.

In one aspect of the invention, desirably, neither the first nor second compounds are tertiary amines since these materials do not transport electrons well.

In another aspect of the invention, if the first or second compound includes a 6-membered aromatic ring as part of its structure, and this ring includes a nitrogen atom, then the nitrogen atom is desirably further complexed to a trivalent metal. Under certain conditions, materials with a free (uncomplexed) nitrogen atom may cause adverse effects in EL devices. In a further embodiment, neither the first nor second compounds include phenanthroline or a derivative thereof, and neither the first nor second compounds include triazine or a derivative thereof.

In all embodiments, the first compound has the lowest LUMO value of all the compounds in the layer and at least one of the second compounds is a low voltage electron transport material as described in the invention.

The invention provides a simplified OLED device for producing light by having a first compound mixed with a second compound(s) in an electron-transporting layer. The combination of both the first and second compounds in the further layer of the invention in the aforementioned ratios, give devices that have reduced drive voltages even lower than the devices in which either the first or second compounds are incorporated alone in said layer. Devices of the invention have lower power consumption requirements and hence longer battery lifetimes.

Embodiments of the invention may also exhibit high operational stability and give low voltage rises over the lifetime of the devices and can be produced with high reproducibility and consistently to provide good light efficiency.

FIG. 1 shows one embodiment of the invention in which hole-injecting and electron-injecting layers are present. The electron-transporting layer in this embodiment is the said further layer containing both the first compound and the second compound(s) and is adjacent to the electron-injecting layer. When there is no electron-injecting layer present, the said further layer is adjacent to the cathode. In other embodiments there may be more than one hole-injecting, electron-injecting and electron transporting layers. When more than one electron-transporting layers are present, the said further layer of the invention may be adjacent to the cathode while the additional electron transporting layers are adjacent to the light-emitting layer(s). Additionally, when more than one electron-transporting layers are present, the said further layer of the invention may be adjacent to the light-emitting layer with the additional electron transporting layers adjacent to the cathode.

The further layer as described above, can be an emitting or non-emitting layer. In one desirable embodiment, the further layer is non-emitting. Typically, the primary function of the layer is to transport electrons with the result that the OLED device requires a lower voltage for operation than either of the first or second compound alone in the device. When emitting, the electroluminescence from said layer can enhance the overall emission from the device. When non-emitting, either the first or second compound or both should desirably be essentially colorless or non-emitting.

One useful embodiment of the invention is an OLED device comprising a cathode, an anode, a light emitting layer, and on the cathode side of said emitting layer, a further layer containing a) a first compound that contains at least 2 fused rings and has the lowest LUMO value of the compounds in the layer, the amount being greater than or equal to 10% by volume and less than 100% by volume of the layer;

b) at least one second compound that is a low voltage electron transport material, exhibiting a higher LUMO value than the first compound, the total amount of said compound(s) being less than or equal to 90% by volume and more than 0% by volume of the layer; and provided, that when paragraphs a) and b) each contain a single compound and the compound of paragraph a) is tris(8-quinolinolato)aluminum(III), then the compound of paragraph b) is not 4,7-diphenyl-1,10-phenanthroline.

At least one of the aforementioned 2 fused rings can be a carbocyclic ring, or at least one of the fused rings can be a heterocyclic ring.

Another useful embodiment of the invention is an OLED device comprising a cathode, an anode, a light emitting layer, and on the cathode side of said emitting layer, a further layer containing a) a first compound that contains at least 3 fused rings and has the lowest LUMO value of the compounds in the layer, the amount being greater than or equal to 10% by volume and less than 100% by volume of the layer;

b) at least one second compound that is a low voltage electron transport material, exhibiting a higher LUMO value than the first compound, the total amount of said compound(s) being less than 90% by volume and more than 0% by volume of the layer; and provided, that when paragraphs a) and b) each contain a single compound and the compound of paragraph a) is tris(8-quinolinolato)aluminum(III), then the compound of paragraph b) is not 4,7-diphenyl-1,10-phenanthroline.

At least one of the aforementioned 3 fused rings can be a carbocyclic ring, or at least one of the fused rings can be a heterocyclic ring.

In a further embodiment, the first compound contains at least 4 fused rings. Suitably, the 4 fused rings can be carbocyclic rings.

As used herein and throughout this application, the term carbocyclic and heterocyclic rings or groups are generally as defined by the *Grant & Hackh's Chemical Dictionary*, Fifth Edition, McGraw-Hill Book Company. A carbocyclic ring is any aromatic or non-aromatic ring system containing only carbon atoms and a heterocyclic ring is any aromatic or non-aromatic ring system containing both carbon and non-carbon atoms such as nitrogen (N), oxygen (O), sulfur (S), phosphorous (P), silicon (Si), gallium (Ga), boron (B), beryllium (Be), indium (In), aluminum (Al), and other elements found in the periodic table useful in forming ring systems. For the purpose of this invention, also included in the definition of a heterocyclic ring are those rings that include coordinate bonds. The definition of a coordinate bond can be found in *Grant & Hackh's Chemical Dictionary*, page 91. In essence, a coordinate bond is formed when electron rich atoms such as O or N, donate a pair of electrons to electron deficient atoms such as Al or B. One such example is found in tris(8-quinolinolato) aluminum(III), also referred to as Alq, wherein the nitrogen on the quinoline moiety donates its lone pair of electrons to the aluminum atom thus forming the heterocycle and hence providing Alq with a total of 3 fused rings.

Carbocyclic and heterocyclic ring systems useful for the current invention for the first and second compounds are selected from metal and non-metal chelated oxinoids, anthracenes, bipyridyls, butadienes, imidazoles, phenanthrenes, phenanthrolines, styrylarylenes, benzazoles, buckministerfullerene-$C_{60}$ (also known as buckyball or fullerene-$C_{60}$), tetracenes, xanthenes, perylenes, coumarins, rhodamines, quinacridones, dicyanomethylenepyrans, thiopyrans, polymethines, pyrylliums, fluoranthenes, periflanthrenes, silacyclopentadienes or siloles, thiapyrylliums, triazines, carbostyryls, metal and non-metal chelated bis (azinyl)amines, metal and non-metal chelated bis(azinyl) methenes.

More specifically, the first and second compounds of the invention can be selected from compounds represented by Formula I:

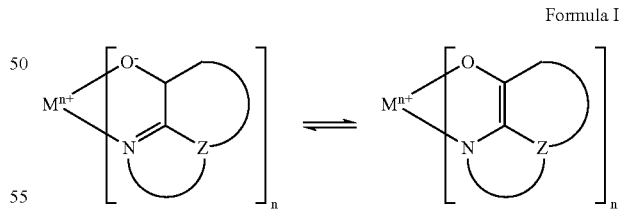

Formula I wherein

M represents a metal or non-metal;

n is an integer of from 1 to 4; and

Z independently in each occurrence represents the atoms completing a nucleus having at least two fused aromatic rings.

The first and second compounds can also be selected from compounds represented by Formula II:

$(R^s\text{-}Q)_2\text{-}M\text{-}O\text{-}L$          Formula II wherein
M is a metal or non-metal;
Q in each occurrence represents a substituted 8-quinolinolato ligand;
$R^S$ represents an 8-quinolinolato ring substituent chosen to block sterically the attachment of more than two substituted 8-quinolinolato ligands to the M atom; and
L is a phenyl or aromatic fused ring moiety, which can be substituted with hydrocarbon groups such that L has from 6 to 24 carbon atoms.

Both first and second compounds can be selected from compounds represented by Formula I, or both may be selected from compounds represented by Formula II, with the provisos that the compounds have different LUMO values, that at least one of the second compound is a low voltage electron-transporting material and that the second compound has the highest LUMO value. Additional second compounds can be selected having Formulae I and II.

The first compound of the invention can be selected from chelated bis(azinyl)amines and chelated bis(azinyl)methenes which are represented by Formulae III and IV in which boron and nitrogen form a coordinated bond:

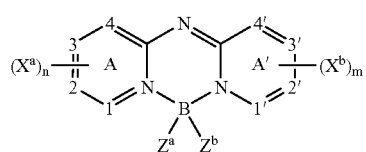

Formula III

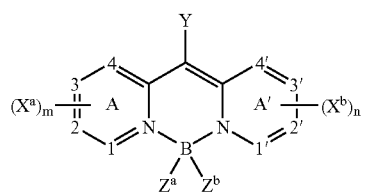

Formula IV wherein:
A and A' represent independent azine ring systems corresponding to 6-membered aromatic ring systems containing at least one nitrogen;
each $X^a$ and $X^b$ is an independently selected substituent, two of which may join to form a fused ring to A or A';
m and n are independently 0 to 4;
$Z^a$ and $Z^b$ are independently selected substituents;
Y is hydrogen or a substituent; and
1, 2, 3, 4, 1', 2', 3', and 4' are independently selected as either carbon or nitrogen atoms.

Additional first compounds can be selected from naphthacene derivatives that are represented by Formulae V:

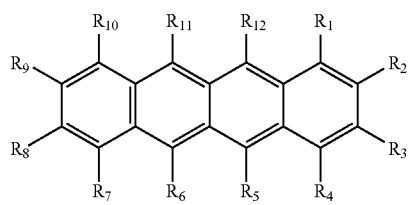

Formula V wherein:
$R_1$, $R_2$, $R_3$, $R_4$, $R_5$, $R_6$, $R_7$, $R_8$, $R_9$, $R_{10}$, $R_{11}$, and $R_{12}$ are independently selected as hydrogen or substituents;

provided that any of the indicated substituents may join to form further fused rings.

A preferred first compound of the invention represented by Formula V are those in which at least one of $R_1$, $R_2$, $R_3$, $R_4$, $R_5$, $R_6$, $R_7$, $R_8$, $R_9$, $R_{10}$, $R_{11}$, and $R_{12}$ are independently selected from alkyl and aryl groups.

In one desirable embodiment, $R_1$, $R_3$, $R_4$, $R_7$, $R_9$, $R_{10}$, represent hydrogen; $R_2$ and $R_8$ represent hydrogen or independently selected alkyl groups; and $R_5$, $R_6$, $R_{11}$, and $R_{12}$ represent independently selected aryl groups.

In another suitable embodiment, the first compound is represented by Formula Va.

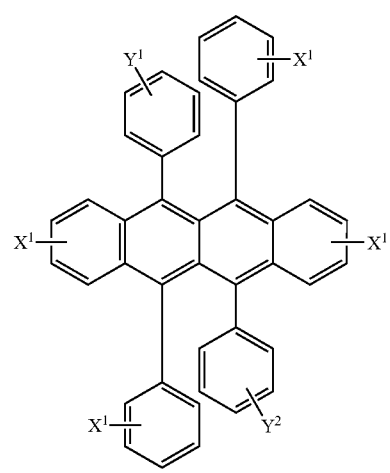

Formula Va

In Formula (Va), $X^1$ represents hydrogen or a substituent, and $Y^1$ represents hydrogen or an independently selected substituent. Illustrative examples of such substituents include alkyl groups, such as methyl groups and t-butyl groups and aromatic groups, such as phenyl groups and naphthyl groups. Desirably $X^1$ and $Y^1$ do not both represent hydrogen. The aromatic rings in Formula (Va) may be further substituted.

Other first compounds can be selected from anthracene derivatives that are represented by Formulae VI:

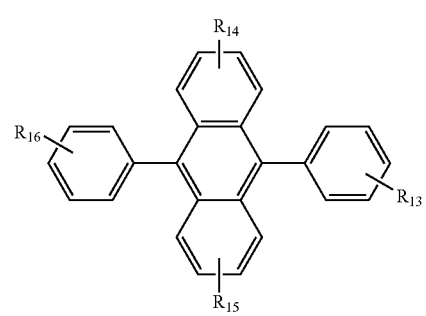

Formula VI wherein:
$R_{13}$, $R_{14}$, $R_{15}$ and $R_{16}$ represent hydrogen or one or more substituents selected from the following groups:
Group 1: hydrogen, alkyl and alkoxy groups typically having from 1 to 24 carbon atoms;
Group 2: a ring group, typically having from 6 to 20 carbon atoms;

Group 3: the atoms necessary to complete a carbocyclic fused ring group such as naphthyl, anthracenyl, pyrenyl, and perylenyl groups, typically having from 6 to 30 carbon atoms;

Group 4: the atoms necessary to complete a heterocyclic fused ring group such as furyl, thienyl, pyridyl, and quinolinyl groups, typically having from 5 to 24 carbon atoms;

Group 5: an alkoxylamino, alkylamino, and arylamino group typically having from 1 to 24 carbon atoms; and Group 6: fluorine, chlorine, bromine and cyano radicals.

In another aspect of the invention, an OLED device comprises a cathode, an anode, a light emitting layer, and on the cathode side of said emitting layer, a further layer containing:

(a) a first compound that is represented by Formula (V), the amount being greater than 10% by volume and less than 100% by volume of the layer; and (b) at least one second compound that is a low voltage electron transport material, exhibiting a higher LUMO value than the first compound, the total amount of said second compound(s) being less than 90% by volume and more than 0% by volume of the layer.

Suitably the amount of the first compound can be greater than 20%, greater than 40%, or even greater than 60% of the layer by volume. The LUMO value of the first compound is desirably −2.40 eV or lower, typically −2.50 eV or lower, or even −2.70 eV or lower. In one embodiment, the first compound is represented by Formula (Va).

Desirably, the second compound, that is low voltage electron transport material, has a test voltage no more than 50% higher, or 40% higher, or desirably no more than 25% higher than Alq. In one embodiment, the second compound is represented by Formula (I). In another embodiment, the second compound is Alq(tris(8-quinolinolato)aluminum (III)).

More specifically, the first compound of the invention can be selected from compounds represented by the following structures:

A-1

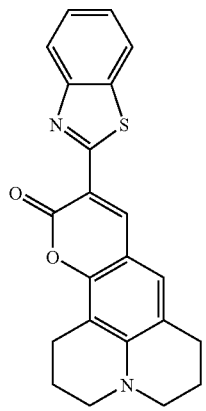

A-2

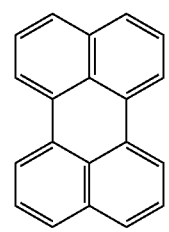

A-3

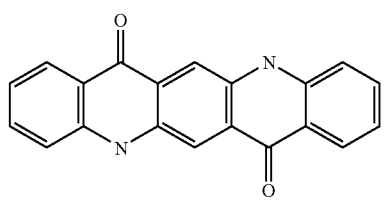

A-4

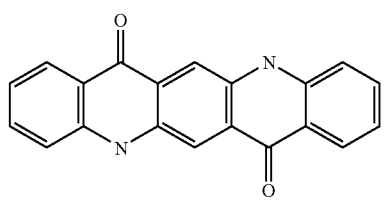

A-5

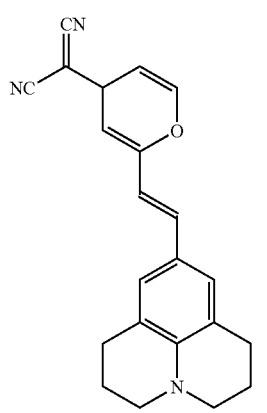

A-6

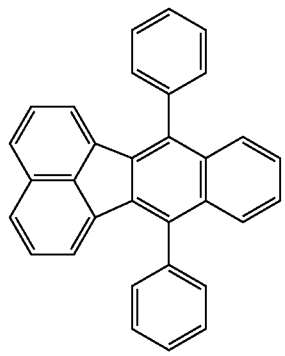

Also included in structures A-1 to A-6 are compounds containing the A-1 through A-6 structural features with substituents suitable to render said structures with the desired properties to function as first compound materials of the invention.

Specifically the first compound of the invention can be selected from the following group;

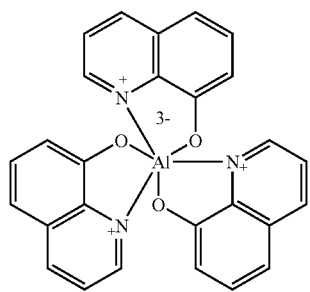
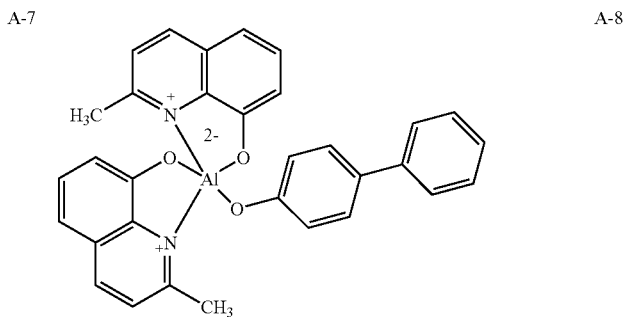
A-7
A-8
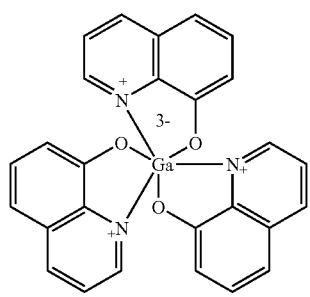
A-9
A-10
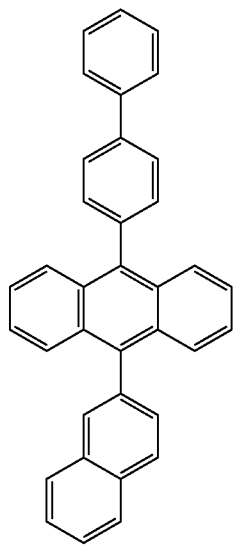
A-11
A-12
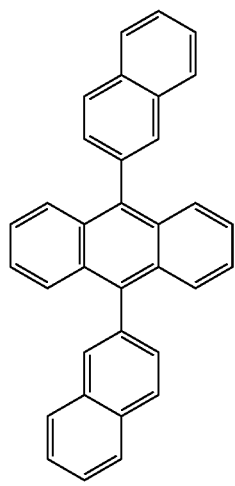
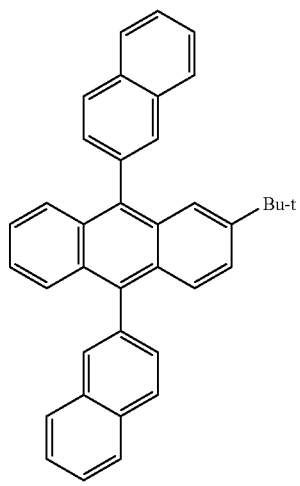

-continued
A-13
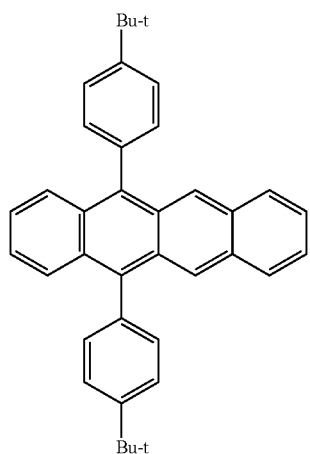
A-14
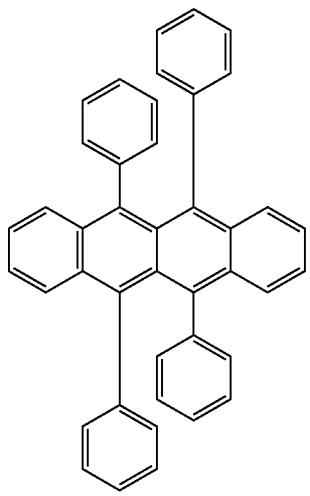
A-15
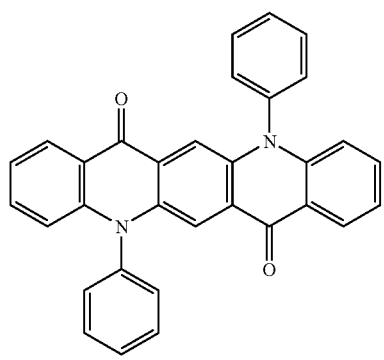
A-16
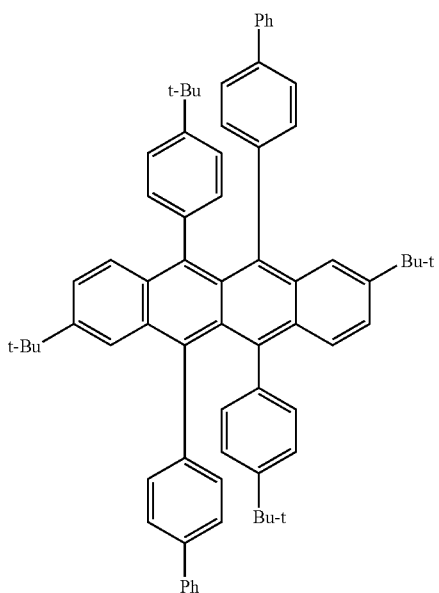
A-17
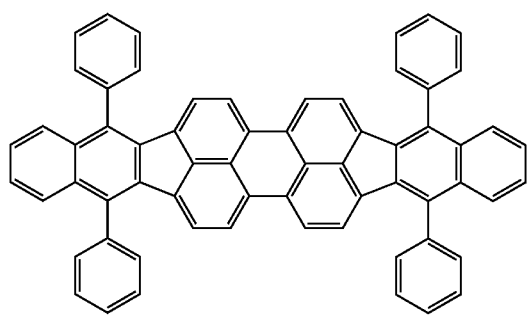
A-18
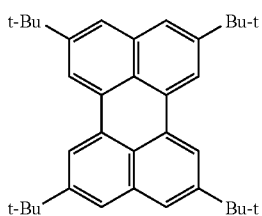

-continued
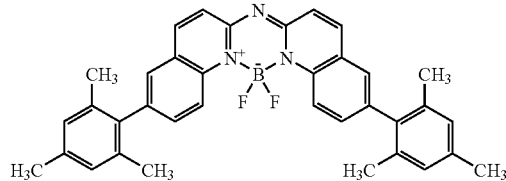
A-19
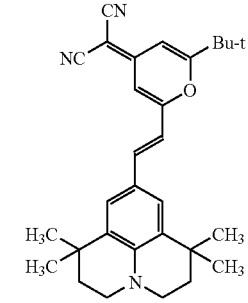
A-20
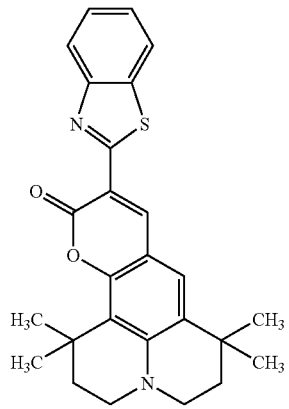
A-21
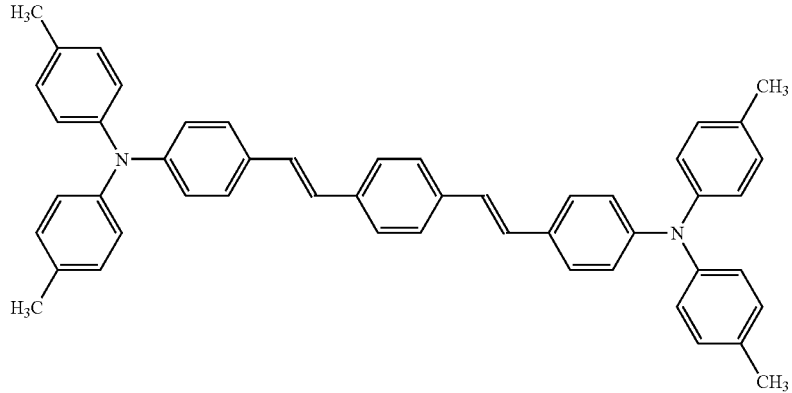
A-22
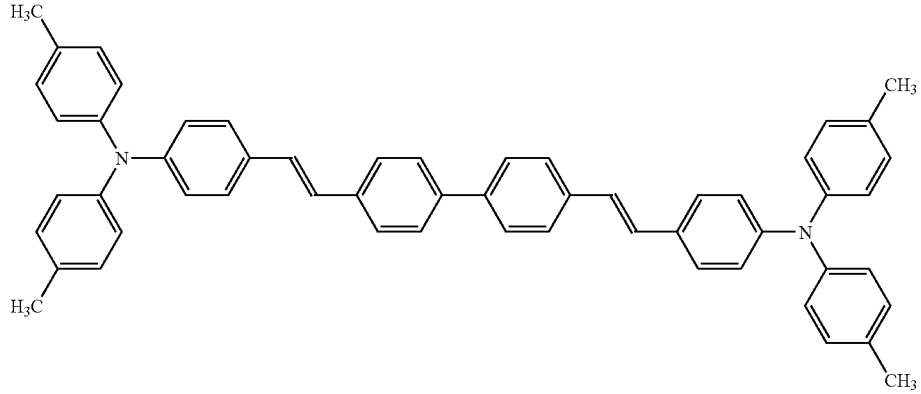
A-23

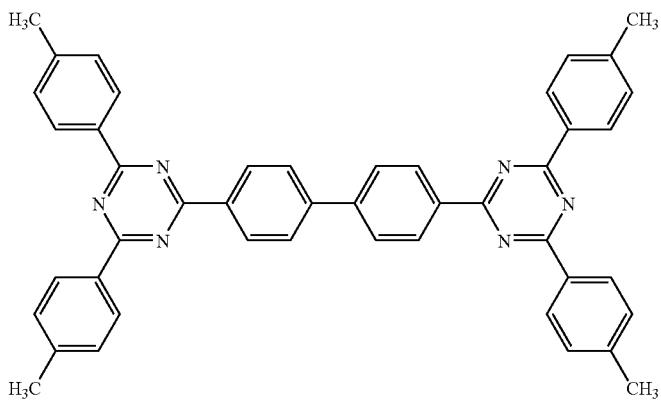

A-24

Second compounds of the invention can be selected from phenanthroline derivatives represented by Formula VII:

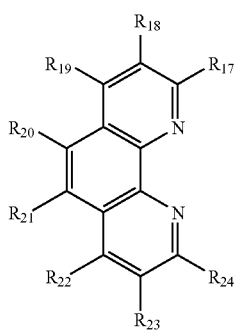

Formula VII wherein
$R_{17}$, $R_{18}$, $R_{19}$, $R_{20}$, $R_{21}$, $R_{22}$, $R_{23}$ and $R_{24}$ are hydrogen or substituents; and
provided that any of the indicated substituents may join to form further fused rings.

Heterocyclic derivatives, represented by Formula VIII form a group of materials from which the second compounds of the invention can be selected:

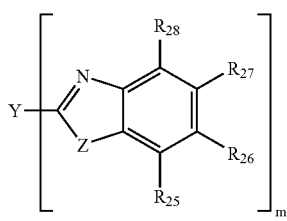

Formula VIII wherein
m is an integer of from 3 to 8;
Z is O, $NR_{29}$, or S;
$R_{25}$, $R_{26}$, $R_{27}$, $R_{28}$ and $R_{29}$ are hydrogen; alkyl of from 1 to 24 carbon atoms; aryl or hetero-atom substituted aryl of from 5 to 20 carbon atoms; or halo; or are the atoms necessary to complete a fused carbocyclic or heterocyclic ring; and Y is a linkage unit usually comprising an alkyl or ary group that conjugately or unconjugately connects the multiple benzazoles together.

Additional second compounds of the invention can be selected from silacyclopentadiene or silole derivatives represented by Formula IX:

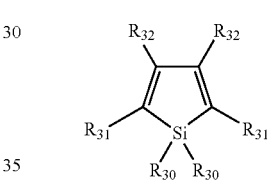

Formula IX wherein
$R_{30}$, $R_{31}$, and $R_{32}$ are hydrogen or substituents or are the atoms necessary to complete a fused carbocyclic or heterocyclic ring.

Other second compounds of the invention can be selected from triazine derivatives represented by Formula X:

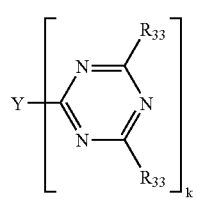

Formula X wherein
k is an integer of from 1 to 4;
$R_{33}$ is hydrogen, substituents or carbocyclic or heterocyclic rings; and
Y is a linkage unit usually comprising an alkyl or ary group that conjugately or unconjugately connects the multiple triazines together.

Specific second compounds based on formulae I, II, VII, VIII, IX and X are shown in the following structures:

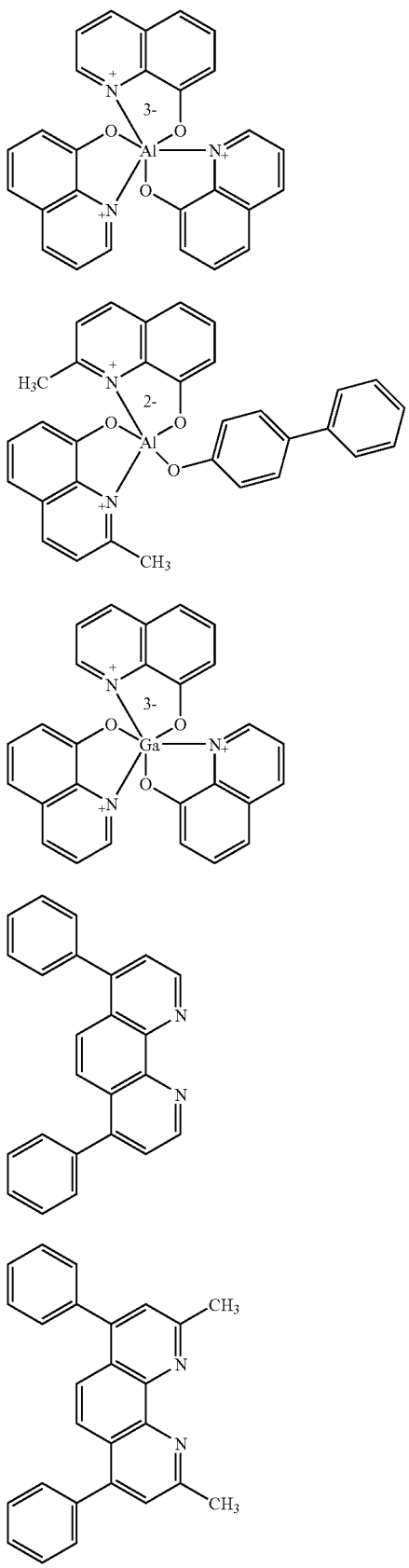

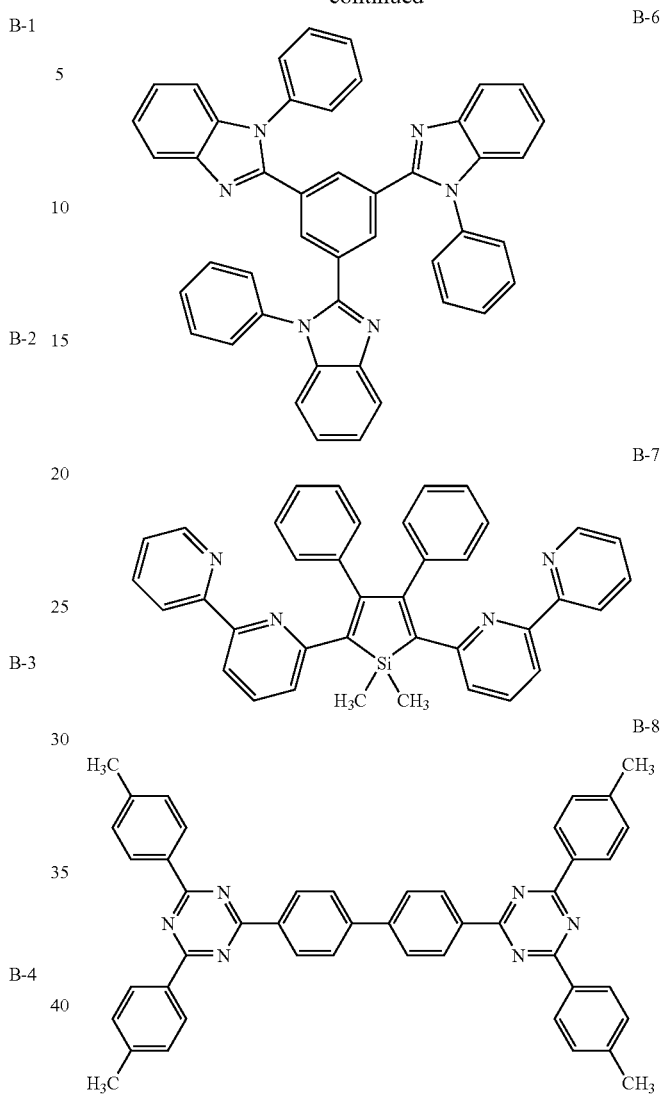

First and second compounds useful in the invention are any of those known in the art that meet the LUMO requirements of the invention and wherein at least one of the second compounds, if more than one is present, is a low voltage electron transporting material as defined in the invention.

The amount of the first compound in the layer is greater than or equal to 10% by volume of the layer but less than 100%, and the total amount of the second compound(s) is less than or equal to 90% by volume of the layer but more than 0% by volume. Embodiments of the invention are those in which the amount of the first compound is selected from any value in the aforementioned range and the second compound(s) fulfils the remainder to 100%. Particularly useful ranges for the first compound are 20, 40, 50, 60, 75 and 90% with 80, 60, 50, 40, 25 and 10% respectively, by necessity completing the ranges for the total amount of the second compound(s). In one embodiment, the layer is of uniform composition, that is there is not a concentration gradient between the first and second compounds in the layer.

Preferred combinations of the invention are those wherein the first compound is selected from A-7, A-8, A-9, A-13, A-14, A-15 A-16, A-18, A-19 and A-24, and the second compounds are selected from B-1, B-2, B-3, B-4, B-5, B-6, B-7 and B-8. Desirable combinations include a first compound of Formula (V) or (Va) and a second compound of Formula (I).

The further layer as described in the invention contains a first compound and a second compound, the first compound having a lower LUMO value than the second compound. In addition, the second compound is a low voltage electron-transporting compound. The combination of both the first and second compounds in the further layer of the invention in the aforementioned ratios, give devices that have reduced drive voltages even lower when compared to the devices in which either the first or second compound are incorporated alone in said layer.

Following are the chemical names and acronyms associated with compounds mentioned in the invention:

A-2, perylene; A-7 or B-1, Alq or Alq$_3$, tris(8-quinolinolato) aluminum (III); A-8 or B-2, BAlq; A-9 or B-3, Gaq or Gaq$_3$, tris(8-quinolinolato)gallium(III); A-10,9 -(2-naphthyl)-10-(4-phenyl)phenylanthracene; A-11, ADN, 9,10-bis(2-naphthyl)-anthracene; A-12, tBADN, 2-tert-butyl-9,10-bis(2-naphthyl)-anthracene; A-13, tBDPN, 5,12-bis[4-tert-butylphenyl]naphthacene; A-14, rubrene, 5,6,11,12-tetraphenylnaphthacene; A-18, TBP, 2,5,8,11-tetra-tert-butylperylene; B-4, BPhen, 4,7-diphenyl-1,10-phenanthroline; B-5, BCP, 2,9-dimethyl-4,7-diphenyl-1,10-phenanthroline; B-6, TPBI, 2,2',2"-(1,3,5-benzenetriyl)tris[1-phenyl-1H-benzimidazole]; and A-24 or B-8, TRAZ, 2,2'-(1,1-biphenyl)-4,4'-diylbis(4,6-(p-tolyl)-1,3,5-triazine).

For use herein, the term 8-quinolinolato ligand, is a ligand derived from 8-hydroxyquinoline wherein the nitrogen in the 1-position of quinoline coordinates, by donating its free pair of electrons to a metal or non-metal atom bound to the hydroxyl group in the 8-position, with the metal or non-metal atom accepting the electrons, to form a coordinate bond and a chelated or heterocyclic ring system. $R^S$ is an 8-quinolinolato-ring substituent chosen to block sterically the attachment of more than two substituted 8-quinolinolato ligands to the metal or non-metal atom. Preferred $R^s$ groups are selected from alkyl and aryl groups. L groups are hydrocarbons of from 6 to 24 carbon atoms. Preferred L groups are selected from alkyl, carbocyclic and heterocyclic groups. Y groups are selected from alkyl, carbocyclic or heterocyclic groups. Preferred Y groups are aryl or biphenyl groups. M can be any suitable metal or non-metal found in the periodic table that can be used to form compounds of Formulae I and II. For example, M can be an alkali metal, such as lithium, sodium, or potassium; an alkaline earth metal, such as magnesium or calcium; an earth metal, such as aluminum or gallium, or a transition metal such as zinc or zirconium. Generally any monovalent, divalent, trivalent, or tetravalent metals known to be a useful chelating metal can be employed. Also included are boron and beryllium. Additional examples of first and second compounds represented by Formula II can be found in Bryan et al., U.S. Pat. No. 5,141,671, incorporated herein by reference.

The EL device of the invention is useful in any device where stable light emission is desired such as a lamp or a component in a static or motion imaging device, such as a television, cell phone, DVD player, or computer monitor.

Typical embodiments of the invention provide not only improved drive voltage but can also provide improved luminance efficiency, operational stability and low voltage rise.

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecyl-benzenesulfonamido, N-methyltetradecylsulfonamido, N,N-dipropylsulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron. Such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

General Device Architecture

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT).

There are numerous configurations of the organic layers wherein the present invention can be successfully practiced. Essential requirements are a cathode, an anode, a HTL and a LEL. A more typical structure is shown in FIG. 1 for OLED 100, and contains a substrate 110, an anode 120, an optional hole-injecting layer 130, a hole-transporting layer 132, a light-emitting layer 134, an electron-transporting layer 136, an optional electron-injecting layer 138 and a cathode 140. These layers are described in detail below. Note that the substrate may alternatively be located adjacent to the cathode, or the substrate may actually constitute the anode or cathode. Also, the total combined thickness of the organic layers is preferably less than 500 nm.

The light-emitting layer can be constructed of a single layer or multiple layers. If a single layer, it can be fabricated to emit any color of light, with the selection chosen depending on the application, and most notably from the red, green and blue regions of the spectrum. If the device is required to emit white light, then several layers emitting different colors of light with sufficient spectral breadth are needed so that when combined, white light is formed.

The anode and cathode of the OLED are connected to a voltage/current source 150, through electrical conductors 160. Applying a potential between the anode and cathode such that the anode is at a more positive potential than the cathode operates the OLED. Holes are injected into the organic EL element from the anode. Enhanced device stability can sometimes be achieved when the OLED is operated in an AC mode where, for some time period in cycle, the potential bias is reversed and no current flows. An example of an AC driven OLED is described in U.S. Pat. No. 5,552,678.

Substrate

The substrate 110 can either be light transmissive or opaque, depending on the intended direction of light emission. The light transmissive property is desirable for viewing the EL emission through the substrate. Transparent glass or organic material are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials. Of course it is necessary to provide in these device configurations a light-transparent top electrode.

Anode

The conductive anode layer 120 is commonly formed over the substrate and, when EL emission is viewed through the anode, it should be transparent or substantially transparent to the emission of interest. Common transparent anode materials used in this invention are indium-tin oxide (ITO) and tin oxide, but other metal oxides can work including, but not limited to, aluminum- or indium-doped zinc oxide (IZO), magnesium-indium oxide, and nickel-tungsten oxide. In addition to these oxides, metal nitrides, such as gallium nitride, and metal selenides, such as zinc selenide, and metal sulfides, such as zinc sulfide, can be used in layer 120. For applications where EL emission is viewed through the top electrode, the transmissive characteristics of layer 120 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

Hole-Injecting Layer (HIL)

While not always necessary, it is often useful that a hole-injecting layer 130 be provided between anode 120 and hole-transporting layer 132. The hole-injecting material can serve to improve the film formation property of subsequent organic layers and to facilitate injection of holes into the hole-transporting layer. Suitable materials for use in the hole-injecting layer include, but are not limited to, porphyrinic compounds such as those described in U.S. Pat. No. 4,720,432, and plasma-deposited fluorocarbon polymers such as those described in U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer 132 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. Additionally, the hole-transporting layer may be constructed of one or more layers such that each layer can be doped or un-doped with the same or different light emitting material. The thickness of the HTL can be any suitable thickness. It can be in the range of from 0.1 to 300 nm. In one form, the aromatic tertiary amine can be an arylamine, such as a monoarylamine, diarylamine, triarylamine, or a polymeric arylamine group. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural formula (A).

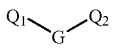

(A)

wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring group, e.g., a naphthalene. When G is an aryl group, it is conveniently a phenylene, biphenylene, or naphthalene group.

A useful class of triarylamine groups satisfying structural formula (A) and containing two triarylamine groups is represented by structural formula (B):

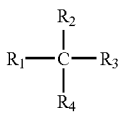

(B)

where
  $R_1$ and $R_2$ each independently represents a hydrogen atom, an aryl group, or an alkyl group or $R_1$ and $R_2$ together represent the atoms completing a cycloalkyl group; and
  $R_3$ and $R_4$ each independently represents an aryl group, which is in turn substituted with a diaryl substituted amino group, as indicated by structural formula (C):

(C)

wherein $R_5$ and $R_6$ are independently selected aryl groups. In one embodiment, at least one of $R_5$ or $R_6$ contains a polycyclic fused ring group, e.g., a naphthalene.

Another class of aromatic tertiary amine groups are the tetraaryldiamines. Desirable tetraaryldiamines groups include two diarylamino groups, such as indicated by formula (C), linked through an arylene group. Useful tetraaryldiamines include those represented by formula (D).

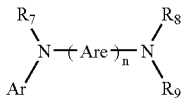

(D)

wherein
  each Are is an independently selected arylene group, such as a phenylene or anthracene group,
  n is an integer of from 1 to 4, and
  Ar, $R_7$, $R_8$, and $R_9$ are independently selected aryl groups.

In a typical embodiment, at least one of Ar, $R_7$, $R_8$, and $R_9$ is a polycyclic fused ring group, e.g., a naphthalene The various alkyl, alkylene, aryl, and arylene groups of the foregoing structural formulae (A), (B), (C) and (D), can each in turn be substituted. Typical substituents include alkyl groups, alkoxy groups, aryl groups, aryloxy groups, and halogen such as fluoride, chloride, and bromide. The various alkyl and alkylene groups typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene groups are usually phenyl and phenylene moieties.

The hole-transporting layer can be formed of a single or a mixture of aromatic tertiary amine compounds. Specifically, one may employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl(NPB)
4,4'-Bis[N-(1-naphthyl)-N-(2-naphthyl)amino]biphenyl (TNB)
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine (MTDATA)
4,4'-Bis[N-(3-methylphenyl)-N-phenylamino]biphenyl (TPD Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 134 of the organic EL element comprises a luminescent or fluorescent material where electroluminescence is produced as a result of electron-hole pair recombination in this region. The light-emitting layer can be comprised of a single material, but more commonly consists of non-electroluminescent compounds doped with an electroluminescent guest compound or compounds where light emission comes primarily from the electroluminescent compound and can be of any color. The non-electroluminescent compound or compounds in the light-emitting layer can be an electron-transporting material, as defined below, a hole-transporting material, as defined above, or another material or combination of materials that support hole-electron recombination. The electroluminescent compound is usually chosen from highly fluorescent dyes, but phosphorescent compounds, e.g., transition metal complexes as described in WO 98/55561, WO 00/18851, WO 00/57676, and WO 00/70655 are also useful. Electroluminescent compounds can be coated as 0.01 to 50% into the non-electroluminescent component material, but typically coated as 0.01 to 30% and more typically coated as 0.01 to 15% into the non-electroluminescent component. The thickness of the LEL can be any suitable thickness. It can be in the range of from 0.1 mm to 100 mm.

An important relationship for choosing a dye as a electroluminescent component is a comparison of the bandgap potential which is defined as the energy difference between the highest occupied molecular orbital and the lowest unoccupied molecular orbital of the molecule. For efficient energy transfer from the non-electroluminescent compound to the electroluminescent compound molecule, a necessary condition is that the band gap of the electroluminescent compound is smaller than that of the non-electroluminescent compound or compounds.

Non-electroluminescent compounds and emitting molecules known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Metal complexes of 8-hydroxyquinoline and similar derivatives (Formula E) constitute one class of useful non-electroluminescent component compounds capable of supporting electroluminescence, and are particularly suitable for light emission of wavelengths longer than 500 nm, e.g., green, yellow, orange, and red.

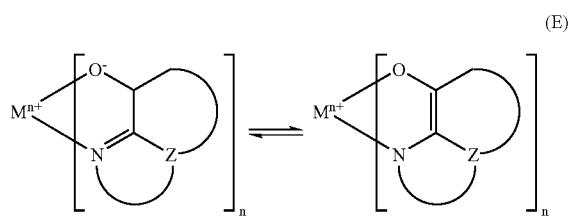

(E)

wherein
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such as aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:
CO-1: Aluminum trisoxine [alias, tris(8-quinolinolato)aluminum(III)]
CO-2: Magnesium bisoxine [alias, bis(8-quinolinolato) magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]
CO-10: Bis(2-methyl-8-quinolinato)-4-phenylphenolatoaluminum (III)

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

A preferred embodiment of the luminescent layer consists of a host material doped with fluorescent dyes. Using this method, highly efficient EL devices can be constructed. Simultaneously, the color of the EL devices can be tuned by using fluorescent dyes of different emission wavelengths in a common host material. Tang et al. in commonly assigned U.S. Pat. No. 4,769,292 has described this dopant scheme in considerable details for EL devices using Alq as the host material.

Shi et al. in commonly assigned U.S. Pat. No. 5,935,721 has described this dopant scheme in considerable details for the blue emitting OLED devices using 9,10-di-(2-naphthyl) anthracene (ADN) derivatives as the host material.

Derivatives of 9,10-di-(2-naphthyl)anthracene (Formula F) constitute one class of useful non-electroluminescent compounds capable of supporting electroluminescence, and are particularly suitable for light emission of wavelengths longer than 400 nm, e.g., blue, green, yellow, orange or red.

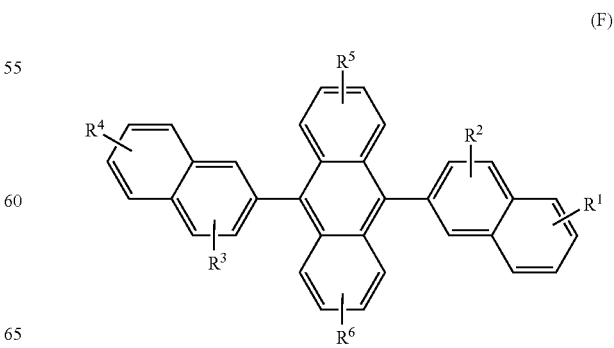

(F)

wherein: $R^1, R^2, R^3, R^4, R^5$, and $R^6$ represent hydrogen or one or more substituents selected from the following groups:

Group 1: hydrogen, alkyl and alkoxy groups typically having from 1 to 24 carbon atoms;

Group 2: a ring group, typically having from 6 to 20 carbon atoms;

Group 3: the atoms necessary to complete a carbocyclic fused ring group such as naphthyl, anthracenyl, pyrenyl, and perylenyl groups, typically having from 6 to 30 carbon atoms;

Group 4: the atoms necessary to complete a heterocyclic fused ring group such as furyl, thienyl, pyridyl, and quinolinyl groups, typically having from 5 to 24 carbon atoms;

Group 5: an alkoxylamino, alkylamino, and arylamino group typically having from 1 to 24 carbon atoms; and Group 6: fluorine, chlorine, bromine and cyano radicals.

Illustrative examples include 9,10-di-(2-naphthyl)anthracene (ADN) and 2-t-butyl-9,10-di-(2-naphthyl)anthracene (TBADN). Other anthracene derivatives can be useful as an non-electroluminescent compound in the LEL, such as diphenylanthracene and its derivatives, as described in U.S. Pat. No. 5,927,247. Styrylarylene derivatives as described in U.S. Pat. No. 5,121,029 and JP 08333569 are also useful non-electroluminescent materials for blue emission. For example, 9,10-bis[4-(2,2-diphenylethenyl)phenyl] anthracene, 4,4'-Bis(2,2-diphenylethenyl)-1,1'-biphenyl (DPVBi) and phenylanthracene derivatives as described in EP 681,019 are useful non-electroluminescent materials for blue emission. Another useful non-electroluminescent material capable of supporting electroluminescence for blue-light emission is H-1 and its derivatives shown as follows:

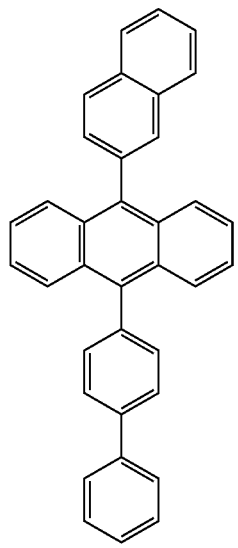

H-1

Benzazole derivatives (Formula G) constitute another class of useful non-electroluminescent components capable of supporting electroluminescence, and are particularly suitable for light emission of wavelengths longer than 400 nm, e.g., blue, green, yellow, orange or red.

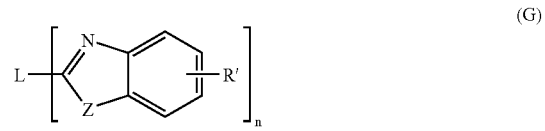

(G)

where:
n is an integer of 3 to 8;
Z is —O, —NR or —S where R is H or a substituent; and
R' represents one or more optional substituents where R and each R' are H or alkyl groups such as propyl, t-butyl, and heptyl groups typically having from 1 to 24 carbon atoms; carbocyclic or heterocyclic ring groups such as phenyl and naphthyl, furyl, thienyl, pyridyl, and quinolinyl groups and atoms necessary to complete a fused aromatic ring group typically having from 5 to 20 carbon atoms; and halo such as chloro, and fluoro;
L is a linkage unit usually comprising an alkyl or ary group which conjugately or unconjugately connects the multiple benzazoles together.

An example of a useful benzazole is 2,2',2"-(1,3,5-benzenetriyl)tris[1-phenyl-1H-benzimidazole], (TPBI).

Distyrylarylene derivatives as described in U.S. Pat. No. 5,121,029 are also useful non-electroluminescent component materials in the LEL.

Desirable fluorescent electroluminescent components include groups derived from fused ring, heterocyclic and other compounds such as anthracene, tetracene, xanthene, perylene, rubrene, pyran, rhodamine, quinacridone, dicyanomethylenepyran, thiopyran, polymethine, pyrilium thiapyrilium, and carbostyryl compounds. Illustrative examples of useful electroluminescent components include, but are not limited to, the following:

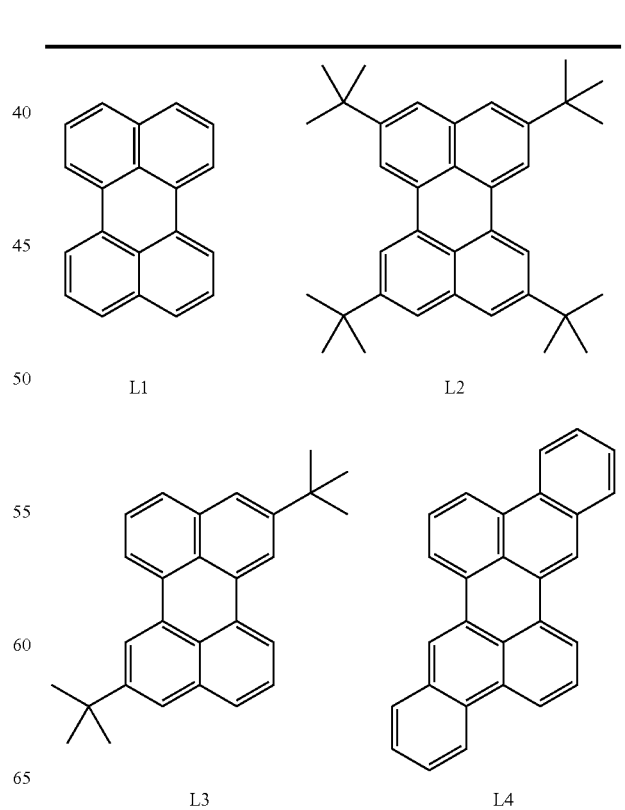

L1     L2

L3     L4

-continued

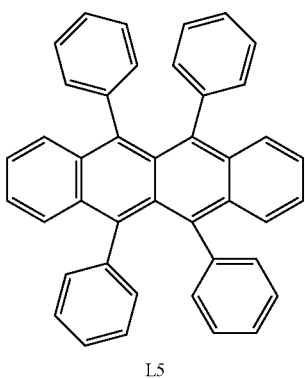

L5

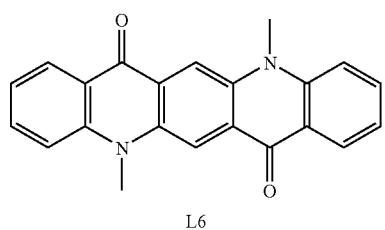

L6

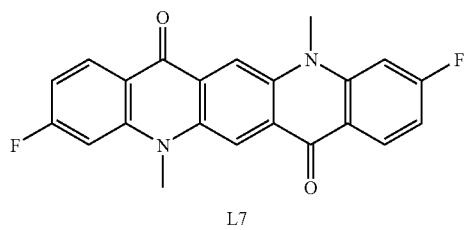

L7

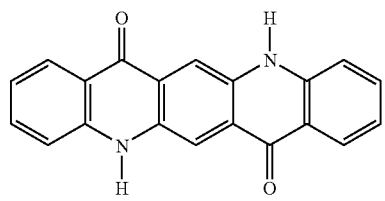

L8

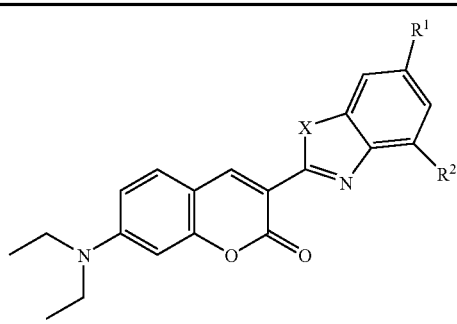

|     | X | R1     | R2     |
|-----|---|--------|--------|
| L9  | O | H      | H      |
| L10 | O | H      | Methyl |
| L11 | O | Methyl | H      |
| L12 | O | Methyl | Methyl |
| L13 | O | H      | t-butyl|
| L14 | O | t-butyl| H      |

-continued

|     |   |         |         |
|-----|---|---------|---------|
| L15 | O | t-butyl | t-butyl |
| L16 | S | H       | H       |
| L17 | S | H       | Methyl  |
| L18 | S | Methyl  | H       |
| L19 | S | Methyl  | Methyl  |
| L20 | S | H       | t-butyl |
| L21 | S | t-butyl | H       |
| L22 | S | t-butyl | t-butyl |

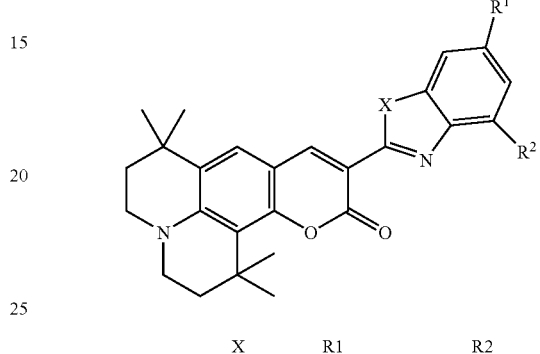

|     | X | R1      | R2      |
|-----|---|---------|---------|
| L23 | O | H       | H       |
| L24 | O | H       | Methyl  |
| L25 | O | Methyl  | H       |
| L26 | O | Methyl  | Methyl  |
| L27 | O | H       | t-butyl |
| L28 | O | t-butyl | H       |
| L29 | O | t-butyl | t-butyl |
| L30 | S | H       | H       |
| L31 | S | H       | Methyl  |
| L32 | S | Methyl  | H       |
| L33 | S | Methyl  | Methyl  |
| L34 | S | H       | t-butyl |
| L35 | S | t-butyl | H       |
| L36 | S | t-butyl | t-butyl |

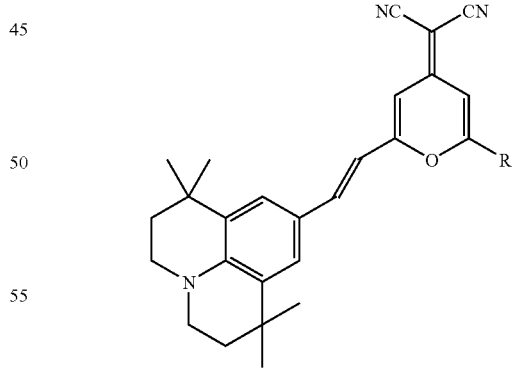

|     | R       |
|-----|---------|
| L37 | phenyl  |
| L38 | methyl  |
| L39 | t-butyl |
| L40 | mesityl |

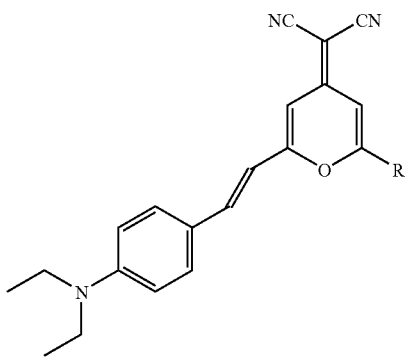

| | R |
|---|---|
| L41 | phenyl |
| L42 | methyl |
| L43 | t-butyl |
| L44 | mesityl |

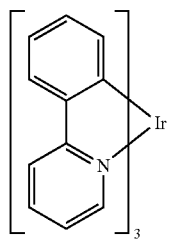 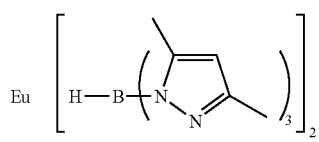

L45    L46

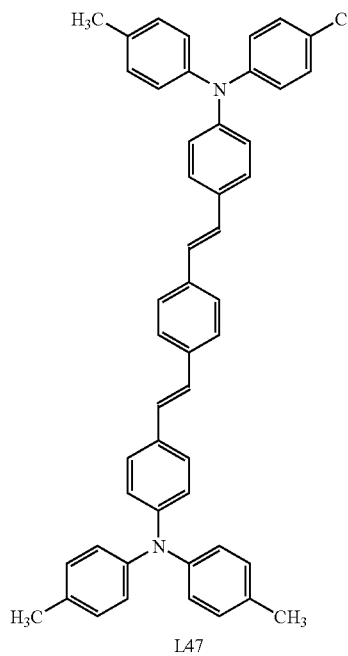

L47

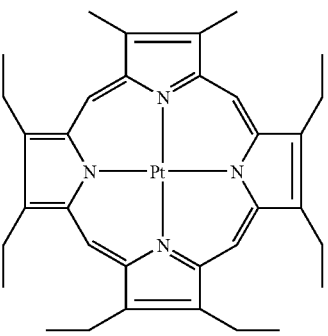

L48

Many blue fluorescent dopants are known in the art, and are contemplated for use in the practice of this invention. Blue dopants or light-emitting materials can be coated as 0.01 to 50% by weight into the host material, but typically coated as 0.01 to 30% and more typically coated as 0.01 to 15% by weight into the host material. The thickness of the blue-light emitting can be any suitable thickness. It can be in the range of from 10 to 100 nm. Particularly useful classes of blue-emitting dopants include perylene and its derivatives such as 2,5,8,11-tetra-tert-butyl perylene (TBP), and distyrylamine derivatives as described in U.S. Pat. No. 5,121,029, such as L47 (structure shown above)

Another useful class of blue-emitting dopants is represented by Formula 2, known as a bis(azinyl0amine borane complex, and is described in commonly assigned U.S. Pat. No. 6,661,023 (Feb. 9, 2003) by Benjamin P. Hoag et al., entitled "Organic Element for Electroluminescent Devices"; the disclosure of which is incorporated herein.

Formula 2

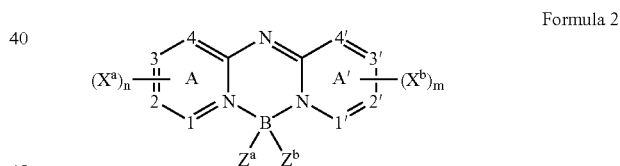

wherein:
A and A' represent independent azine ring systems corresponding to 6-membered aromatic ring systems containing at least one nitrogen;
each $X^a$ and $X^b$ is an independently selected substituent, two of which may join to form a fused ring to A or A';
m and n are independently 0 to 4;
$Z^a$ and $Z^b$ are independently selected substituents; and
1, 2, 3, 4, 1', 2', 3', and 4' are independently selected as either carbon or nitrogen atoms.

Desirably, the azine rings are either quinolinyl or isoquinolinyl rings such that 1, 2, 3, 4, 1', 2', 3', and 4' are all carbon; m and n are equal to or greater than 2; and $X^a$ and $X^b$ represent at least two carbon substituents which join to form an aromatic ring. Desirably, $Z^a$ and $Z^b$ are fluorine atoms.

Preferred embodiments further include devices where the two fused ring systems are quinoline or isoquinoline systems; the aryl or heterocyclic substituent is a phenyl group; there are present at least two $X^a$ groups and two $X^b$ groups which join to form a 6-6 fused ring, the fused ring systems are fused at the 1-2, 3-4, 1'-2', or 3'-4' positions, respectively; one or both of the fused rings is substituted by a phenyl group; and where the dopant is depicted in Formulae 3, 4, or 5.

Formula 3

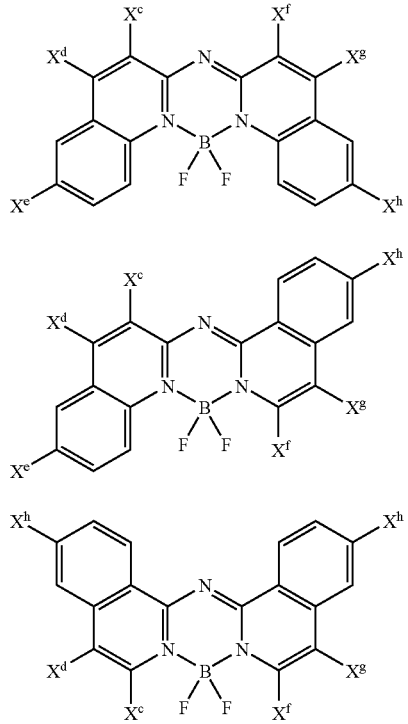

Formula 4

Formula 5 wherein each $X^c$, $X^d$, $X^e$, $X^f$, $X^g$, and $X^h$ is hydrogen or an independently selected substituent, one of which must be an aryl or heterocyclic group.

Desirably, the azine rings are either quinolinyl or isoquinolinyl rings such that 1, 2, 3, 4, 140, 2', 3', and 4' are all carbon; m and n are equal to or greater than 2; and $X^a$ and $X^b$ represent at least two carbon substituents which join to form an aromatic ring, and one is an aryl or substituted aryl group. Desirably, $Z^a$ and $Z^b$ are fluorine atoms.

Illustrative, non-limiting examples of boron compounds complexed by two ring nitrogens of a deprotonated bis(azinyl)amine ligand, wherein the two ring nitrogens are members of different 6,6 fused ring systems in which at least one of the systems contains an aryl or heterocyclic substituent, useful in the present invention are the following:

B-1

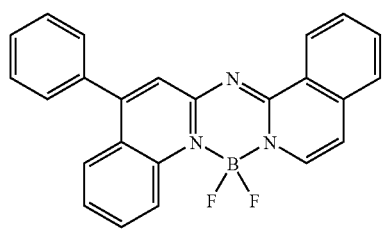

B-2

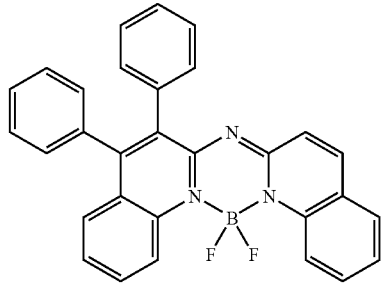

B-3

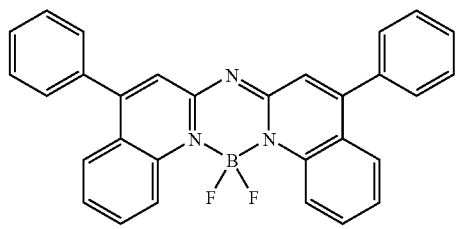

B-4

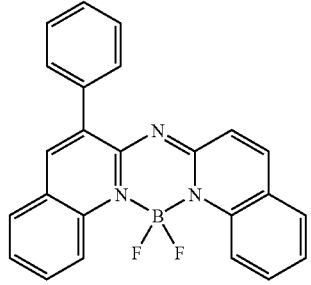

B-5

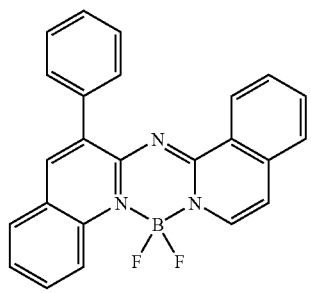

B-6

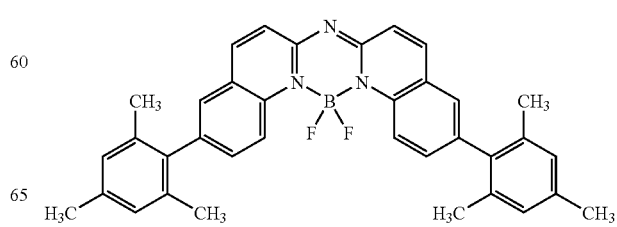

-continued

B-7

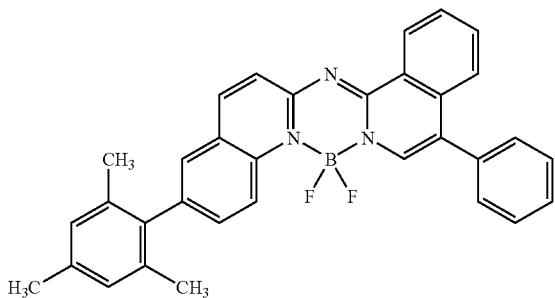

Coumarins represent a useful class of green-emitting dopants as described by Tang et al. in U.S. Pat. Nos. 4,769,292 and 6,020,078. Green dopants or light-emitting materials can be coated as 0.01 to 50% by weight into the host material, but typically coated as 0.01 to 30% and more typically coated as 0.01 to 15% by weight into the host material. Examples of useful green-emitting coumarins include C545T and C545TB. Quinacridones represent another useful class of green-emitting dopants. Useful quinacridones are described in U.S. Pat. No. 5,593,788, publication JP 09-13026A, and commonly assigned U.S. patent application Ser. No. 10/184,356 filed Jun. 27, 2002 by Lelia Cosimbescu, entitled "Device Containing Green Organic Light-Emitting Diode", the disclosure of which is incorporated herein.

Examples of particularly useful green-emitting quinacridones are shown below:

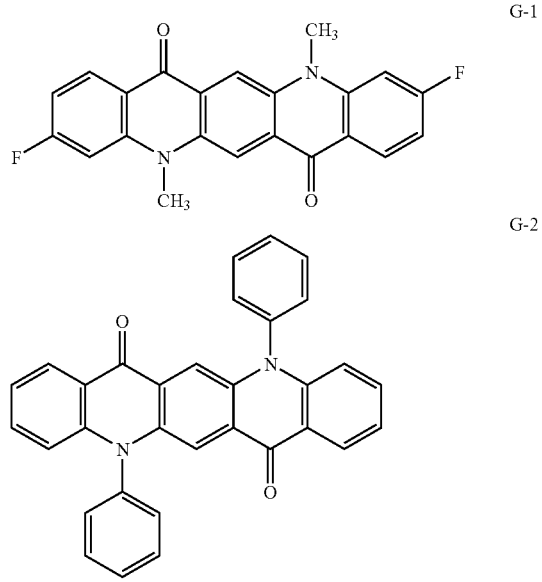

G-1

G-2

Formula 6 below represents another class of green-emitting dopants useful in the invention.

Formula 6

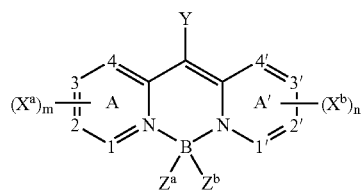

wherein:

A and A' represent independent azine ring systems corresponding to 6-membered aromatic ring systems containing at least one nitrogen;

each $X^a$ and $X^b$ is an independently selected substituent, two of which may join to form a fused ring to A or A';

m and n are independently 0 to 4;

Y is H or a substituent;

$Z^a$ and $Z^b$ are independently selected substituents; and 1, 2, 3, 4, 1', 2', 3', and 4' are independently selected as either carbon or nitrogen atoms.

In the device, 1, 2, 3, 4, 1', 2', 3', and 4' are conveniently all carbon atoms. The device may desirably contain at least one or both of ring A or A' that contains substituents joined to form a fused ring. In one useful embodiment, there is present at least one $X^a$ or $X^b$ group selected from the group consisting of halide and alkyl, aryl, alkoxy, and aryloxy groups. In another embodiment, there is present a $Z^a$ and $Z^b$ group independently selected from the group consisting of fluorine and alkyl, aryl, alkoxy and aryloxy groups. A desirable embodiment is where $Z^a$ and $Z^b$ are F. Y is suitably hydrogen or a substituent such as an alkyl, aryl, or heterocyclic group.

The emission wavelength of these compounds may be adjusted to some extent by appropriate substitution around the central bis(azinyl)methene boron group to meet a color aim, namely green. Some examples of useful formulas follow:

G-3

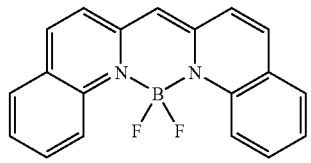

G-4

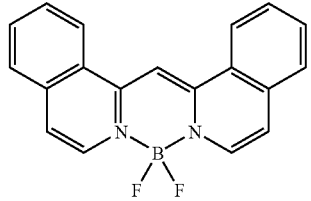

G-5

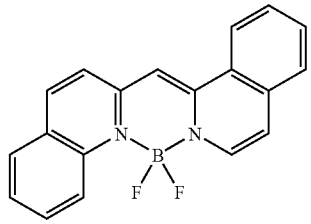

G-6

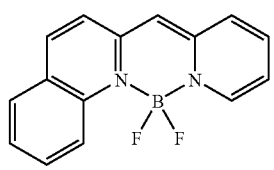

G-7

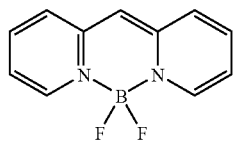

Naphthacenes and derivatives thereof also represent a useful class of emitting dopants, which can be used as stabilizers. These dopant materials can be coated as 0.01 to 50% by weight into the host material, but typically coated as 0.01 to 30% and more typically coated as 0.01 to 15% by weight into the host material. Naphthacene derivative Y-1 (alias t-BuDPN) below, is an example of a dopant material used as a stabilizer:

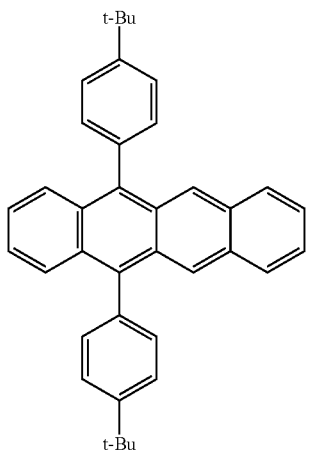

Y-1

Electron-Transporting Layer (ETL)

Preferred thin film-forming materials for use in forming the electron-transporting layer of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials.

In some instances, the electron transport and light emitting layers can optionally be collapsed into a single layer that serves the function of supporting both light emission and electron transportation. The thickness of the ETL can be any suitable thickness. It can be in the range of from 0.1 nm to 100 nm.

Cathode

When light emission is through the anode, the cathode layer 140 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. Cathode materials are comprised of Mg:Ag, Al:Li and Mg:Al alloys. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861, 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Deposition of Organic Layers

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,851,709 and 6,066,357) and inkjet method (U.S. Pat. No. 6,066,357).

Organic materials useful in making OLEDs, for example organic hole-transporting materials, organic light-emitting materials doped with an organic electroluminescent components have relatively complex molecular structures with relatively weak molecular bonding forces, so that care must be taken to avoid decomposition of the organic material(s) during physical vapor deposition. The aforementioned organic materials are synthesized to a relatively high degree of purity, and are provided in the form of powders, flakes, or granules. Such powders or flakes have been used heretofore for placement into a physical vapor deposition source wherein heat is applied for forming a vapor by sublimation or vaporization of the organic material, the vapor condensing on a substrate to provide an organic layer thereon.

Several problems have been observed in using organic powders, flakes, or granules in physical vapor deposition: These powders, flakes, or granules are difficult to handle. These organic materials generally have a relatively low physical density and undesirably low thermal conductivity, particularly when placed in a physical vapor deposition source which is disposed in a chamber evacuated to a reduced pressure as low as $10^{-6}$ Torr. Consequently, powder particles, flakes, or granules are heated only by radiative heating from a heated source, and by conductive heating of particles or flakes directly in contact with heated surfaces of the source. Powder particles, flakes, or granules which are not in contact with heated surfaces of the source are not effectively heated by conductive heating due to a relatively low particle-to-particle contact area; This can lead to nonuniform heating of such organic materials in physical vapor deposition sources. Therefore, result in potentially nonuniform vapor-deposited organic layers formed on a substrate.

These organic powders can be consolidated into a solid pellet. These solid pellets consolidating into a solid pellet from a mixture of a sublimable organic material powder are easier to handle. Consolidation of organic powder into a solid pellet can be accomplished with relatively simple tools. A solid pellet formed from mixture comprising one or more non-luminescent organic non-electroluminescent component materials or luminescent electroluminescent component materials or mixture of non-electroluminescent component and electroluminescent component materials can be placed into a physical vapor deposition source for making organic layer. Such consolidated pellets can be used in a physical vapor deposition apparatus.

In one aspect, the present invention provides a method of making an organic layer from compacted pellets of organic materials on a substrate, which will form part of an OLED.

One preferred method for depositing the materials of the present invention is described in US 2004/0255857 and U.S. Ser. No. 10/945,941 where different source evaporators are used to evaporate each of the materials of the present invention. A second preferred method involves the use of flash evaporation where materials are metered along a material feed path in which the material feed path is temperature controlled. Such a preferred method is described in the following co-assigned patent applications: U.S. Ser. Nos. 10/784,585; 10/805,980; 10/945,940; 10/945,941; 11/050,924; and 11/050,934. Using this second method, each material may be evaporated using different source evaporators or the solid materials may be mixed prior to evaporation using the same source evaporator.

Encapsulation

Most OLED devices are sensitive to moisture and/or oxygen so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890.

The invention and its advantages are further illustrated by the specific examples that follow. The term "percentage" or "percent" and the symbol "%" indicate the volume percent (or a thickness ratio as measured on a thin film thickness monitor) of a particular first or second compound of the total material in the layer of the invention and other components of the devices. If more than one second compound is present, the total volume of the second compounds can also be expressed as a percentage of the total material in the layer of the invention.

The entire contents of the patents and other publications referred to in this specification are incorporated herein by reference.

EXAMPLES

The inventions and its advantages are further illustrated by the specific examples that follow: Example 1 describes LUMO values; Example 2 describes synthesis; Example 3 describes device fabrication; Example 4 describes low voltage electron transport materials as defined in the invention reported as Samples 1-8; Example 5 describes inventive, control and comparison samples reported as Samples 9-31; Example 6 describes inventive and control samples reported as Samples 32-35; and Example 7 is a prior art comparison as Samples 36 and 37. Example 8 describes Samples 38-43 for purposes of comparison.

A-14, A-16, A-18, B-1, B-4 and B-5 are used as single compounds in control devices and as such their use falls outside the scope of the current invention. The combination of compounds B-1 and CBP, B-1 and Liq [lithium quinolate or (8-quinolinolato) lithium (I)] and the combination of compounds A-16 and A-10 also fall outside the scope of the current invention and are used to show that not all combinations of materials give the desired results.

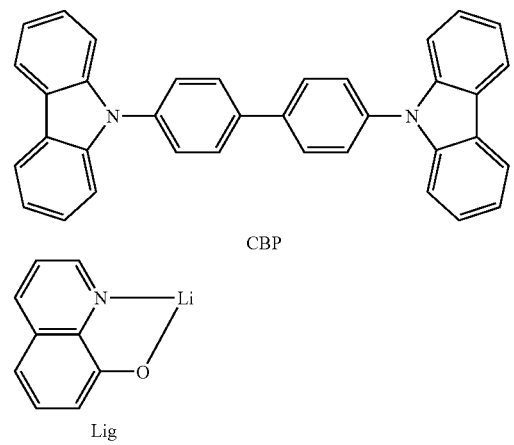

CBP

Liq

B-1, tris(8-quinolinolato)aluminum(III) and B-4,4,7-diphenyl-1,10-phenanthroline individually, are electron transport materials well known in the art.

B-4, the electron transporting material and B-1, the electron injecting material are the subject of Embodiment 2 in US2002/0086180A1, wherein they are co-deposited at the deposition rate ratio of 1:1. Example 7 compares Embodiment 2 of US2002/0086180A1 to the current invention.

Example 1

LUMO Values

An important relationship exists when selecting the first compound and second compound(s) of the invention. A comparison of the LUMO values of the first and second compounds in the layer of the invention, must be carefully considered. In devices of the invention, for there to be a drive voltage reduction over devices that contain only a first compound or only a second compound, there must be a difference in the LUMO values of the compounds. The first compound must have a lower LUMO (more negative) value than the second compound, or compounds.

The LUMO values are typically determined experimentally by electrochemical methods. A Model CHI660 electrochemical analyzer (CH Instruments, Inc., Austin, Tex.) was employed to carry out the electrochemical measurements. Cyclic voltammetry (CV) and Osteryoung square-wave voltammetry (SWV) were used to characterize the redox properties of the compounds of interest. A glassy carbon (GC) disk electrode (A=0.071 cm$^2$) was used as working electrode. The GC electrode was polished with 0.05 um alumina slurry, followed by sonication cleaning in Milli-Q deionized water twice and rinsed with acetone in between water cleaning. The electrode was finally cleaned and activated by electrochemical treatment prior to use. A platinum wire served as counter electrode and a saturated calomel electrode (SCE) was used as a quasi-reference electrode to complete a standard 3-electrode electrochemical cell. Ferrocene (Fc) was used as an internal standard ($E_{Fc}$=0.50 V vs. SCE in 1:1 acetonitrile/toluene, 0.1 M TBAF). Mixture of acetonitrile and toluene (50%/50% v/v, or 1:1) was used as organic solvent system. The supporting electrolyte, tetrabutylammonium tetraflouroborate (TBAF) was recrystallized twice in isopropanol and dried under vacuum. All solvents used were low water grade (<20 ppm water). The testing solution was purged with high purity nitrogen gas for approximately 5 minutes to remove oxygen and a nitrogen blanket was kept on the top of the solution during the course of the experiments. All measurements were performed at ambient temperature of 25±1° C. The oxidation and reduction potentials were determined either by averaging the anodic peak potential (Ep,a) and cathodic peak potential (Ep,c) for reversible or quasi-reversible electrode processes or on the basis of peak potentials (in SWV) for irreversible processes. All LUMO values pertaining to this application are calculated from the following:

Formal reduction potentials vs. SCE for reversible or quasi-reversible processes;

$$E^{o'}_{red} = (E_{pa} + E_{pc})/2$$

Formal reduction potentials vs. Fc;

$$E^{o'}_{red} \text{ vs. } Fc = (E^{o'}_{red} \text{ vs. } SCE) - E_{Fc}$$

where $E_{Fc}$ is the oxidation potential $E_{ox}$, of ferrocene;

Estimated lower limit for LUMO;

$$\text{LUMO} = \text{HOMO}_{Fc} - (E^{o'}_{red} \text{ vs. } Fc)$$

where $\text{HOMO}_{Fc}$ (Highest Occupied Molecular Orbital for ferrocene)=−4.8 eV.

The LUMO values for some first and second compounds are listed in Table 1. To make a selection of compounds useful in the invention, the first compound should have a lower LUMO value than its paired second compound(s).

TABLE 1

LUMO Values for Representative Materials

| Material | LUMO (eV) |
|---|---|
| A-7/B-1 | −2.50 |
| A-8/B-2 | −2.50 |
| A-10 | −2.44 |
| A-11 | −2.45 |
| A-12 | −2.40 |
| A-13 | −2.77 |
| A-14 | −2.83 |
| A-15 | −3.02 |
| A-16 | −2.72 |
| A-17 | −3.24 |
| A-18 | −2.52 |
| A-19 | −2.83 |
| A-22 | −2.35 |
| B-4 | −2.4 |
| B-5 | −2.3 |
| B-6 | −2.3 |
| Liq | −1.85 |

Example 2

Synthesis-Scheme 1

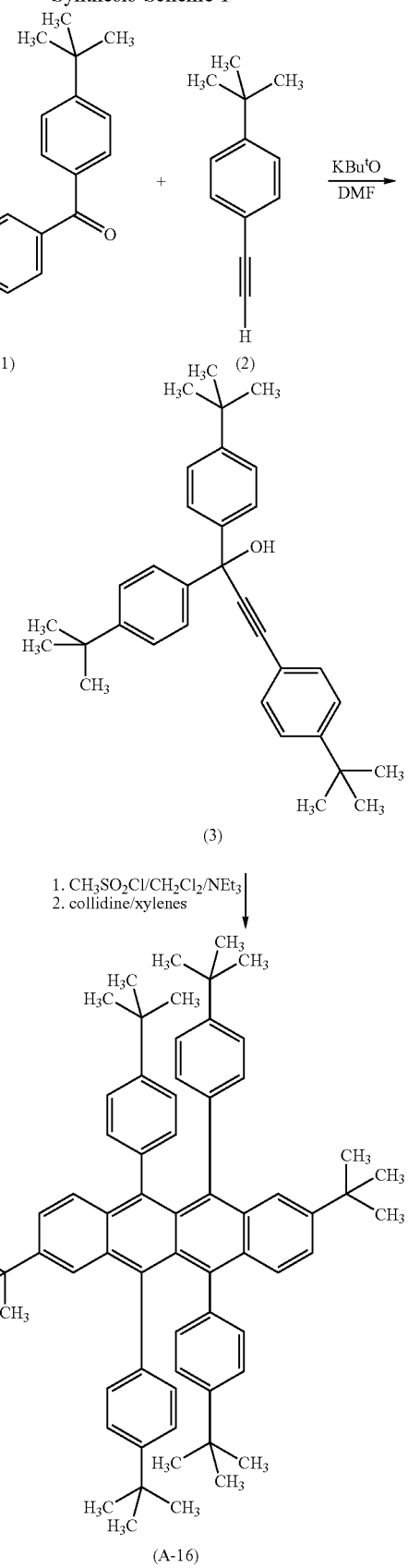

Example 2

Synthesis Method

Preparation of Compound (3):

Under a nitrogen atmosphere, acetylenic compound (2) (2.0 g, 12 mMole), was dissolved in dimethylformamide (DMF) (100 mL) and the solution cool to 0° C. Potassium t-butoxide (KBu$^t$O) (1.4 g, 12 mMole), was added and the mixture stirred well for approximately 15 minutes. To this mixture was then added the benzophenone (1) (3.53 g, 30 mMole). Stirring was continued at 0° C. for approximately 30 minutes and then allowed to come to room temperature over a 1-hour period. At the end of this time the solution was cooled to 0° C. and the reaction treated with saturated sodium chloride (20 mL). The mixture was then diluted with ethyl acetate, washed with 2N—HCl (×3), dried over MgSO$_4$, filtered and concentrated under reduced pressure. The crude product was triturated with petroleum ether to give the product as an off-white solid. Yield of compound (3), 3.0 g.

Preparation of Compound, A-16:

Compound (3) (7.0 g, 15 mMole) was dissolved in methylene chloride (CH$_2$Cl$_2$) (70 mL), and stirred at 0° C. under a nitrogen atmosphere. To this solution was added triethylamine (NEt$_3$) (1.56 g, 15 mMole) and then treated drop by drop with methanesulfonyl chloride (CH$_3$SO$_2$Cl) (1.92 g, 15 mMole), keeping the temperature of the reaction in the range 0-5° C. After the addition the solution was stirred at 0° C. for 30 minutes and then allowed to warm to room temperature over 1 hour. The reaction was then heated to reflux, distilling off the methylene chloride solvent and gradually replacing it with xylenes (a total of 70 mL). When the internal temperature of the reaction reached 80° C., collidine (2.40 g, 19.82 mMole), dissolved in xylenes (10 mL) was added drop by drop over a 10-minute period. The temperature was then raised to 110° C. and held at this temperature for 4 hours. After this period the reaction was cooled and concentrated under reduced pressure. The oily residue was stirred with methanol (70 mL) to give the crude product. This material was filtered off, washed with methanol and petroleum ether to give inventive compound A-16 as a bright red solid. Yield 1.5 g with a melting point of 300-305° C. The product may be further purified by sublimation (250° C. @ 200 millitorr) with a N$_2$ carrier gas.

Example 3

EL Device Fabrication

EL devices satisfying the requirements of the invention and for the purposes of comparison, were constructed in the following manner:

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CF$_x$) hole-injecting layer (HIL) by plasma-assisted deposition of CHF$_3$.
b) A hole-transporting layer (HTL) of N,N'-di-1-naphthalenyl-N,N'-diphenyl-4,4'-diaminobiphenyl (NPB) having a thickness of 75 nm was then evaporated onto a).
c) A 35 nm light-emitting layer (LEL) of tris(8-quinolinolato)aluminum (III) (Alq) was then deposited onto the hole-transporting layer.
d) A 35 nm electron-transporting layer (ETL) of the materials and amounts indicated in Tables 2-7 were then deposited onto the light-emitting layer.
e) On top of the ETL was deposited a 0.5 nm layer of LiF.
f) On top of the LiF layer was deposited a 130 nm layer of Al to form the cathode.

The above sequence completed the deposition of the EL device. The device was then hermetically packaged in a dry glove box for protection

Example 4

Low Voltage Electron Transport Materials

The further layer as described in the invention contains a first compound and a second compound. The second compound is a low voltage electron-transporting compound. The combination of both the first and second compounds in the further layer of the invention in the aforementioned ratios, give devices that have reduced drive voltages that are even lower when compared to the devices in which either the first or second compound are incorporated alone in said layer.

Typically, the low voltage electron transport materials are materials that when incorporated alone into the electron transporting layer, as described in paragraph d) of the device of Example 3, result in drive voltages of 12 volts or less. Low voltage electron transport materials with drive voltages of 10 volts or less are also useful as second compounds of the invention while materials of 8 volts or less are preferred as second compounds. Materials tested for low drive voltages and the results are shown in Table 2.

TABLE 2

Low Voltage Electron Transport Materials

| Sample | Material | Type | Drive Voltage (volts) | Relative Drive Voltage[1] |
|---|---|---|---|---|
| 1 | B-1 | Low | 8.0 | 100 |
| 2 | B-5 | Low | 9.9 | 124 |
| 3 | B-6 | Low | 8.3 | 104 |
| 4 | A-10 | High | 13.7 | 171 |
| 5 | A-13 | High | 15.4 | 193 |
| 6 | A-18 | High | 16.5 | 206 |
| 7 | Liq | High | 12.1 | 151 |
| 8 | CBP | High | 14.3 | 179 |

[1]Voltage relative to B-1 (Alq)

Table 2 shows that compounds B-1, B-5 and B-6 qualify as low voltage electron transport materials, while A-10, A-13, A-18, Liq and CBP do not.

Example 5

Inventive, Control and Comparison Samples

OLED devices satisfying the requirements of the invention were constructed as Samples 9 through Sample 31 in the same manner as Example 3 wherein the materials and their amounts in the layer of paragraph d) are reported in Tables 3 through 7.

TABLE 3

Test Results for EL Devices.
Electron Transport Layer Containing a First Compound(A-14)
and a Second Compound(B-1).

| Sample | Type | A-14/B-1 Vol. % | Drive Voltage (volts) | ΔV (volts) | Yield (cd/A)[1] | Stability[2] |
|---|---|---|---|---|---|---|
| 9 | Control | 0/100 | 9.0 | 0 | 2.79 | 66% |
| 10 | Control | 100/0 | 11.2 | +2.2 | 1.80 | 65% |
| 11 | Inventive | 25/75 | 8.0 | −1.0 | 3.06 | 68% |
| 12 | Inventive | 50/50 | 6.7 | −2.3 | 2.30 | 66% |
| 13 | Inventive | 75/25 | 6.3 | −2.7 | 2.88 | 64% |

[1]Luminance yields reported at 20 mA/cm$^2$.
[2]Stability refers to the % of luminance remaining after the device has operated for 250 hours at 70° C. with a current density of 20 mA/cm$^2$.

TABLE 4

Test Results for EL Devices.
Electron Transport Layer Containing a First Compound(A-16)
and a Second Compound(B-1).

| Sample | Type | A-16/B-1 Vol. % | Drive Voltage (volts) | ΔV (volts) | Yield (cd/A)[1] | Stability[2] |
|---|---|---|---|---|---|---|
| 14 | Control | 0/100 | 7.6 | 0 | 3.53 | 64% |
| 15 | Control | 100/0 | 12.1 | +4.5 | 2.64 | 61% |
| 16 | Inventive | 50/50 | 7.2 | −0.4 | 3.47 | 69% |
| 17 | Inventive | 75/25 | 6.2 | −1.4 | 3.36 | 66% |

[1]Luminance yields reported at 20 mA/cm$^2$.
[2]Stability refers to the % of luminance remaining after the device has operated for 250 hours at 70° C. with a current density of 20 mA/cm$^2$.

TABLE 5

Test Results for EL Devices.
Electron Transport Layer containing a First Compound(A-18)
and a Second Compound (B-5).

| Sample | Type | A-18/B-5 Vol. % | Drive Voltage (volts) | Yield (cd/A)[1] | Stability[2] |
|---|---|---|---|---|---|
| 18 | Control | 0/100 | 10.8 | 3.27 | 51% |
| 19 | Control | 100/0 | 12.2 | 2.92 | ND[3] |
| 20 | Inventive | 50/50 | 6.18 | 3.03 | 53% |
| 21 | Inventive | 75/25 | 6.42 | 3.01 | 68% |

[1]Luminance yields reported at 20 mA/cm$^2$.
[2]Stability refers to the % of luminance remaining after the device has operated for 240 hours at 70° C. with a current density of 20 mA/cm$^2$.
[3]Not determined due to the high voltage.

TABLE 6

Comparative Test Results for EL Devices.
B-1 with a Lower LUMO Value than CBP.

| Sample | Type | B-1/CBP Vol. % | Drive Voltage (volts) |
|---|---|---|---|
| 22 | Control | 0/100 | 14.3 |
| 23 | Control | 100/0 | 7.4 |
| 24 | Comparative | 25/75 | 9.9 |
| 25 | Comparative | 50/50 | 8.4 |
| 26 | Comparative | 75/25 | 8.2 |

TABLE 7

Comparative Test Results for EL Devices.
A-16 with a Lower LUMO Value than A-10.

| Sample | Type | A-16/A-10 Vol. % | Drive Voltage (volts) |
|---|---|---|---|
| 27 | Control | 0/100 | 14.5 |
| 28 | Control | 100/0 | 11.3 |
| 29 | Comparative | 25/75 | 12.4 |
| 30 | Comparative | 50/50 | 13.1 |
| 31 | Comparative | 75/25 | 12.0 |

The results shown in Tables 3, 4 and 5 show, that overall the devices of the invention have superior performance to their respective controls of 100% first or second compounds.

The results in Tables 6 and 7 show that not all combinations of materials give beneficial results. In Table 6, B-1 is classified as the first compound because it has a lower LUMO than CBP. However, CBP does not fulfill the requirements of the invention because being the second compound, it is not a low voltage electron transporting material as defined in the invention. In Table 7, A-16 is classified as the first compound because it has a lower LUMO than A-10. However, A-10 does not fulfill the requirements of the invention because being the second compound, it too is not a low voltage electron transporting material as defined in the invention.

Example 6

Inventive and Control Samples

EL devices satisfying the requirements of the invention and for the purposes of comparison, were constructed as Samples 33-35 in the following manner:

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CF$_x$) hole-injecting layer (HIL) by plasma-assisted deposition of CHF$_3$.
b) A hole-transporting layer (HTL) of N,N'-di-1-naphthalenyl-N,N'-diphenyl-4,4'-diaminobiphenyl (NPB) having a thickness of 75 nm was then evaporated onto a).
c) A 35 nm light-emitting layer (LEL) of 9-(2-naphthyl)-10-(4-phenyl)phenylanthracene, (A-10), (95%); NPB (5%); and 2,5,8,11-tetra-tert-butylperylene, (A-18, TBP)(2%) was then deposited onto the hole-transporting layer.
d) A 35 nm electron-transporting layer (ETL) of a mixture of B-1 and A-16 in the amounts indicated in Table 8 was then deposited onto the light-emitting layer.
e) On top of the ETL was deposited a 0.5 nm layer of LiF.
f) On top of the LiF layer was deposited a 130 nm layer of Al to form the cathode.

The above sequence completed the deposition of the EL device. The device was then hermetically packaged in a dry glove box for protection.

TABLE 8

Test Results for EL devices.
Electron Transport Layer containing a First Compound(A-16)
and a Second Compound (B-1).

| Sample | Type | A-16/B-1 Vol. % | Drive Voltage | Yield (cd/A)[1] | Stability[2] | Voltage Rise[4] (volts) |
|---|---|---|---|---|---|---|
| 32 | Control | 0/100 | 8.1 | 4.6 | 79% | 1.8 |
| 33 | Control | 100/0 | 10.4 | 3.6 | ND[3] | ND[3] |
| 34 | Inventive | 50/50 | 7.9 | 4.7 | 92% | 0.8 |
| 35 | Inventive | 75/25 | 7.1 | 4.9 | 79% | 1.5 |

[1]Luminance yields reported at 20 mA/cm².
[2]Stability refers to the % of luminance remaining after the device has operated for 240 hours at 70° C. with a current density of 20 mA/cm².
[3]Not determined due to the high voltage.
[4]The voltage rise is the change in voltage that occurs after the device has operated for 240 hours at 70° C. with a current density of 20 mA/cm².

Figure 2:
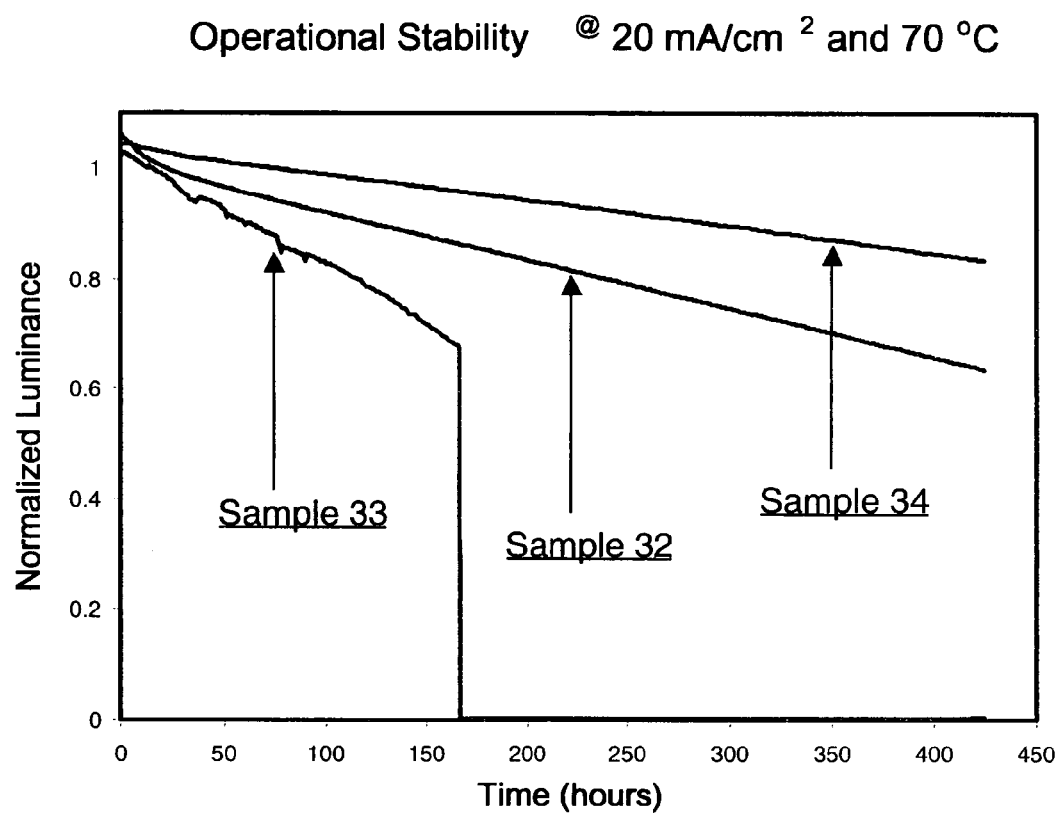
FIG. 2 is a graph, showing normalized luminance versus operational time, demonstrating the operational stability of the OLED devices fabricated in accordance with the present invention as well as the prior art.

Sample 32 is the OLED device with 100% of the second compound and Sample 33 is the OLED device with 100% of the first compound. It can be seen from Table 8 that overall, Samples of the invention 34 and 35, are far superior to the controls in terms of drive voltage, stability and voltage rise. FIG. 2 shows the superiority of the Operational Stability in graphic form, of Sample 34 over a 400-hour period. After only approximately 160 hours of operation, the device of Sample 33 fails.

Example 7

Inventive and Comparison Samples

OLED devices satisfying the requirements of the invention were constructed as Samples 36 and Sample 37 in the same manner as Example 3 wherein the materials and their amounts in the layer of paragraph d) are reported in Table 9.

TABLE 9

Test Results for EL Devices.
B-1/B-4 Comparison versus
First Compound(A-16) and Second Compound (B-4).

| Sample | Type | B-1/B-4 Vol. % | A-16/B-4 Vol. % | Stability[1] | Voltage Rise[2] (volts) |
|---|---|---|---|---|---|
| 36 | Comparison | 50/50 | | 65% | +0.4 |
| 37 | Inventive | | 50/50 | 77% | +0.1 |

[1]Stability refers to the % of luminance remaining after the device has operated for 240 hours at 70° C. with a current density of 20 mA/cm².
[2]The voltage rise is the change in voltage that occurs after the device has operated for 240 hours at 70° C. with a current density of 20 mA/cm².

Table 9 shows that the stability and voltage rise of the current invention in Sample 37 is superior to comparison Sample 36.

Example 9

Fabrication of Comparison Samples

Samples 38 through 43, for the purposes of comparison, were constructed in the following in the manner. A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon ($CF_x$) hole-injecting layer (HIL) by plasma-assisted deposition of $CHF_3$.
b) A hole-transporting layer (HTL) of N,N'-di-1-naphthalenyl-N,N'-diphenyl-4,4'-diaminobiphenyl (NPB) having a thickness of 75 nm was then evaporated onto a).
c) A 35 nm light-emitting layer (LEL) of tris(8-quinolinolato)aluminum (III) (Alq) was then deposited onto the hole-transporting layer.
d) A 35 nm electron-transporting layer (ETL) of Alq or lithium quinolate (Liq) or mixtures of the two, as indicated in indicated in Table 10, was then deposited onto the light-emitting layer.
e) On top of the ETL was deposited a 0.5 nm layer of LiF.
f) On top of the LiF layer was deposited a 100 nm layer of Al to form the cathode.

The above sequence completed the deposition of the EL device. The device was then hermetically packaged in a dry glove box for protection. The cells thus formed were tested for luminous efficiency and color at an operating current of 20 mA/cm² and the results are reported in Table 9 in the form of efficiency (w/A), luminance yield (cd/A), and voltage (V).

TABLE 9

Device performance from Example 8.

| Sample | Type | Liq/B-1 Vol. % | Drive Voltage (volts) | ΔV (volts) | Yield (cd/A)[1] |
|---|---|---|---|---|---|
| 38 | Comp. | 0/100 | 8.29 | 0 | 3.23 |
| 39 | Comp. | 10/90 | 8.49 | +0.20 | 3.40 |
| 40 | Comp. | 25/75 | 8.44 | +0.15 | 3.36 |
| 41 | Comp. | 50/50 | 8.92 | +0.63 | 3.18 |
| 42 | Comp. | 75/25 | 10.90 | +2.61 | 2.75 |
| 43 | Comp. | 100/0 | 12.10 | +3.81 | 2.69 |

[1]Luminance yields reported at 20 mA/cm².

It can be seen from Table 9 that the devices using a mixture of Liq and B-1 (Alq) as the electron-transporting material did not give a voltage reduction relative to the devices using only Alq.

The invention has been described in detail with particular reference to certain preferred embodiments thereof, but it will be understood that variations and modifications can be effected within the spirit and scope of the invention. For example, multiple first compounds and multiple second compounds can be used in said further layer of the invention as long as they have the correct LUMO values. In addition, the invention can be used in devices emitting any colored light and said layer can be adjacent to other layers on either side, between the cathode and the LEL.

The patents and other publications referred to are incorporated herein in their entirety.

| | PARTS LIST |
|---|---|
| 100 | OLED |
| 110 | Substrate |
| 120 | Anode |
| 130 | Hole-Injecting layer (HIL) |
| 132 | Hole-Transporting layer (HTL) |
| 134 | Light-Emitting layer (LEL) |
| 136 | Electron-Transporting layer (ETL) |
| 138 | Electron-Injecting layer (EIL) |

| -continued |
| PARTS LIST |
| 140 | Cathode |
| 150 | Voltage/Current Source |
| 160 | Electrical Connectors |

The invention claimed is:

1. An OLED device comprising a cathode, an anode, a light emitting layer, and on the cathode side of said emitting layer, a further layer, wherein the further layer is an electron-transporting layer containing a mixture of:
   a) a first compound that has the lowest LUMO value of the compounds in the layer, the amount being greater than 40% by volume and less than 100% by volume of the layer wherein the first compound is represented by formula V:

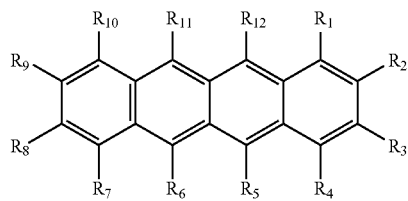

Formula V wherein:
$R_1$, $R_3$, $R_4$, $R_7$, $R_9$, $R_{10}$, represent hydrogen; $R_2$ and $R_8$ represent hydrogen or independently selected alkyl groups; $R_5$, $R_6$, $R_{11}$, and $R_{12}$ represent independently selected aryl groups; and b) at least one second compound that is a low voltage electron transport material, exhibiting a higher LUMO value than the first compound, the total amount of said compound(s) being less than or equal to 60% by volume and more than 0% by volume of the layer wherein the second compound is represented by Formula I:

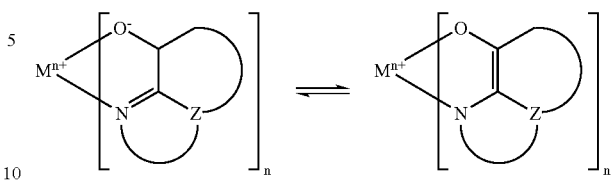

Formula I wherein
M represents Al;
n is 3; and
Z independently in each occurrence represents the atoms completing a quinoline group.

2. The OLED device of claim 1 wherein neither the first nor second compounds comprise a triarylamine group.

3. The OLED device of claim 1 wherein said further layer is adjacent to said light emitting layer and said further layer is also adjacent to an electron-injecting layer.

4. The OLED device of claim 1 wherein said further layer is a non-emitting layer.

5. The OLED device of claim 1 wherein the first compound has a LUMO value of −2.40 eV or lower (more negative).

6. The OLED device of claim 1 wherein the first compound has a LUMO value of −2.70 eV or lower.

7. The OLED device of claim 1 wherein the first compound is present in an amount greater than or equal to 60% by volume and less than 100% by volume of the layer and the second compound(s) is present in a total amount less than or equal to 40% by volume and more than 0% by volume of the layer.

8. The OLED device of claim 7 wherein the first compound has a LUMO value of −2.40 eV or lower.

9. The OLED device of claim 7 wherein the second compound is tris(8-quinolinolato)aluminum (Ill).

* * * * *